(12) United States Patent
Kira et al.

(10) Patent No.: US 10,103,126 B2
(45) Date of Patent: Oct. 16, 2018

(54) LAMINATED SEMICONDUCTOR DEVICE AND MANUFACTURING METHOD OF LAMINATED SEMICONDUCTOR DEVICE

(71) Applicant: FUJITSU LIMITED, Kawasaki-shi, Kanagawa (JP)

(72) Inventors: Hidehiko Kira, Nagano (JP); Norio Kainuma, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/397,136

(22) Filed: Jan. 3, 2017

(65) Prior Publication Data
US 2017/0207199 A1 Jul. 20, 2017

(30) Foreign Application Priority Data
Jan. 15, 2016 (JP) .................. 2016-006203

(51) Int. Cl.
  *H01L 25/065* (2006.01)
  *H01L 25/075* (2006.01)
  (Continued)

(52) U.S. Cl.
  CPC .......... *H01L 25/0657* (2013.01); *H01L 21/56* (2013.01); *H01L 23/16* (2013.01); *H01L 23/3142* (2013.01); *H01L 24/17* (2013.01); *H01L 25/043* (2013.01); *H01L 25/074* (2013.01); *H01L 25/0756* (2013.01); *H01L 25/50* (2013.01); *H01L 2224/05025* (2013.01); *H01L 2224/05147* (2013.01); *H01L 2224/13023* (2013.01); *H01L 2224/13025* (2013.01); *H01L 2224/16113* (2013.01); *H01L 2224/16148* (2013.01); *H01L 2224/17517* (2013.01); *H01L 2224/2919* (2013.01); *H01L 2224/32145* (2013.01); *H01L 2224/73204* (2013.01); *H01L 2224/81191* (2013.01); *H01L 2224/81203* (2013.01); *H01L 2224/83203* (2013.01);
  (Continued)

(58) Field of Classification Search
  CPC ............. H01L 25/0657; H01L 25/0756; H01L 25/043; H01L 25/074; H01L 25/50; H01L 23/16; H01L 23/3142; H01L 2224/17517; H01L 24/17
  See application file for complete search history.

(56) References Cited

U.S. PATENT DOCUMENTS

2003/0045029 A1* 3/2003 Emoto ............... H01L 23/16
                                                    438/109
2007/0181990 A1* 8/2007 Huang .............. H01L 21/561
                                                    257/686
(Continued)

FOREIGN PATENT DOCUMENTS

| JP | 2014-203868 | 10/2014 | |
|---|---|---|---|
| JP | 2015-018893 | 1/2015 | |
| WO | WO 2016099463 A1 * | 6/2016 | ............ H01L 23/13 |

*Primary Examiner* — Joseph C Nicely
(74) *Attorney, Agent, or Firm* — Fujitsu Patent Center

(57) ABSTRACT

A laminated semiconductor device includes: three or more semiconductor chips that are laminated; resins that are disposed among the semiconductor chips, the resins softening by heating; and support members that are disposed among the semiconductor chips and that contacts the adjacent semiconductor chips, the support members deforming by external force when a temperature of the support members reaching a predetermined temperature.

7 Claims, 24 Drawing Sheets

(51) Int. Cl.
  *H01L 25/04*   (2014.01)
  *H01L 23/16*   (2006.01)
  *H01L 25/07*   (2006.01)
  *H01L 21/56*   (2006.01)
  *H01L 23/31*   (2006.01)
  *H01L 23/00*   (2006.01)
  *H01L 25/00*   (2006.01)

(52) U.S. Cl.
  CPC ............... *H01L 2225/06513* (2013.01); *H01L 2225/06541* (2013.01); *H01L 2225/06565* (2013.01); *H01L 2225/06575* (2013.01); *H01L 2225/06593* (2013.01)

(56) References Cited

U.S. PATENT DOCUMENTS

| | | | |
|---|---|---|---|
| 2008/0030205 A1* | 2/2008 | Fujii | B81B 7/02 324/661 |
| 2008/0211089 A1* | 9/2008 | Khan | H01L 23/16 257/723 |
| 2008/0293186 A1* | 11/2008 | Hao | H01L 24/14 438/109 |
| 2011/0089563 A1* | 4/2011 | Kikuchi | H01L 21/565 257/738 |
| 2012/0241925 A1* | 9/2012 | Yoon | H01L 21/563 257/666 |
| 2013/0233375 A1* | 9/2013 | Hamaguchi | H01L 31/0508 136/251 |
| 2014/0210074 A1* | 7/2014 | Chen | H01L 24/11 257/737 |
| 2014/0252634 A1* | 9/2014 | Hung | H01L 23/48 257/773 |
| 2015/0048493 A1* | 2/2015 | Min | H01L 24/83 257/712 |
| 2016/0329304 A1* | 11/2016 | Hatakeyama | H01L 24/97 |
| 2017/0130003 A1* | 5/2017 | Sato | C08G 73/1082 |
| 2017/0229438 A1* | 8/2017 | Razdan | H01L 25/50 |
| 2017/0338190 A1* | 11/2017 | Fujino | H01L 23/562 |

* cited by examiner

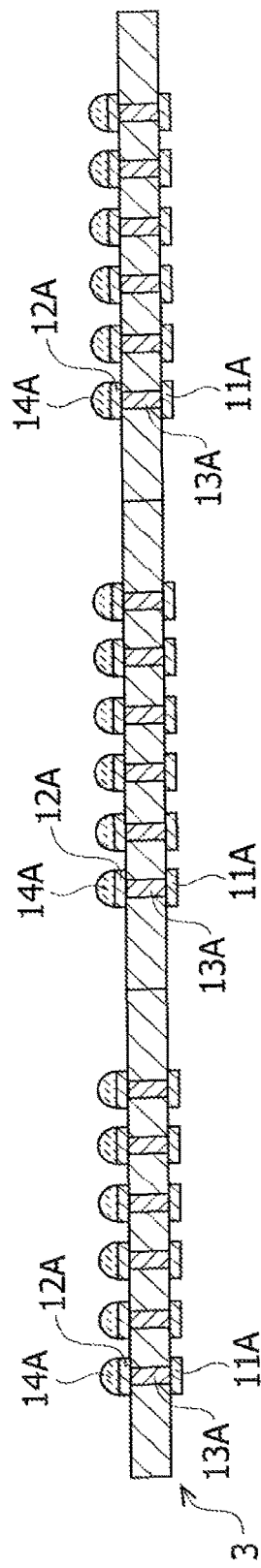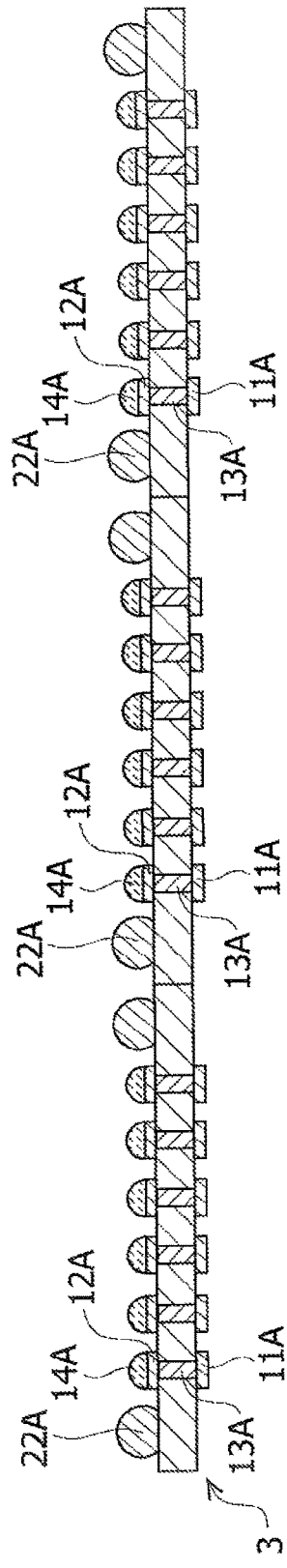

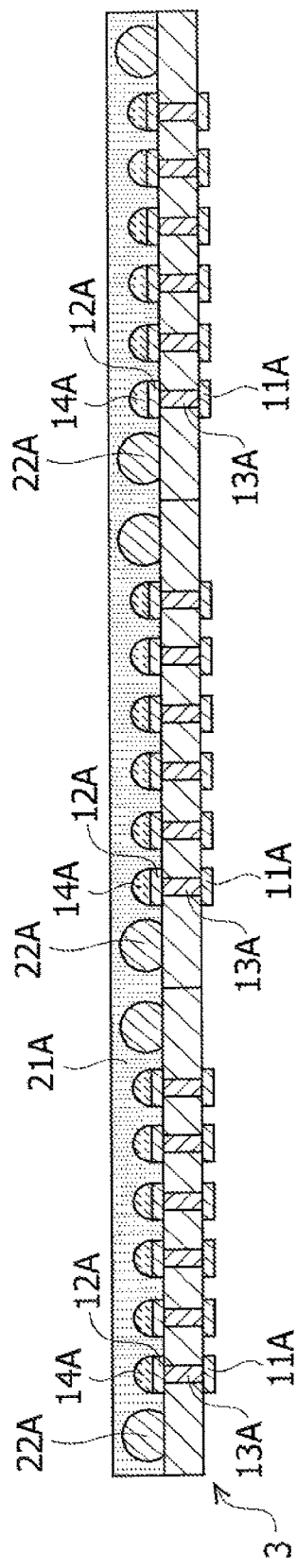
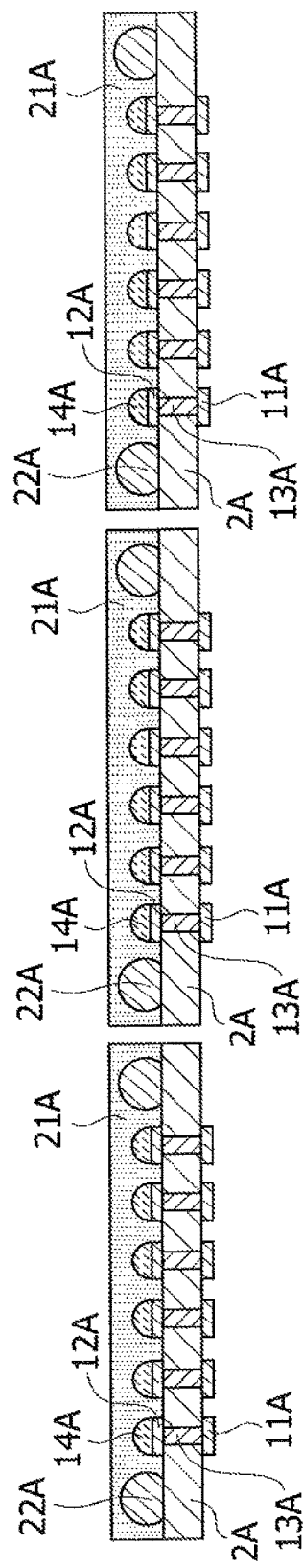
FIG.21A
FIG.21B

FIG.24
ALIGNMENT
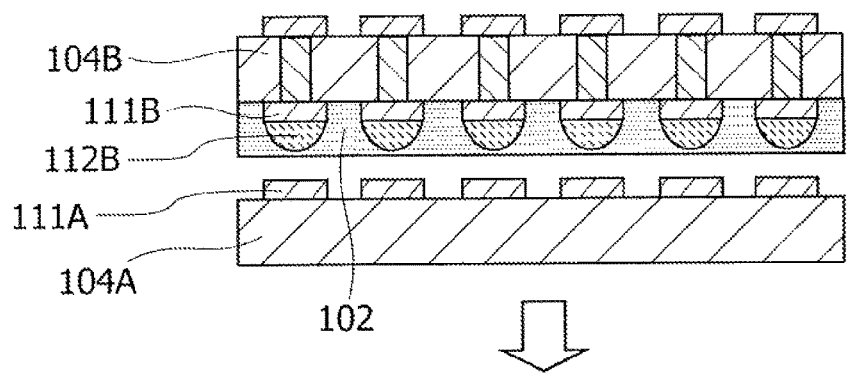
SOLDER JOINT
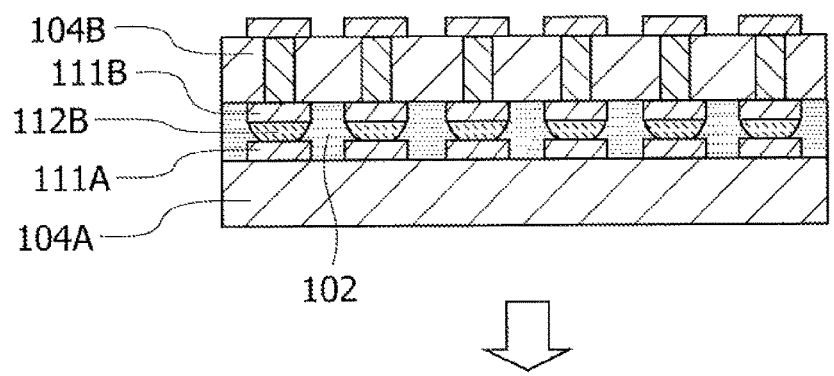
ALIGNMENT
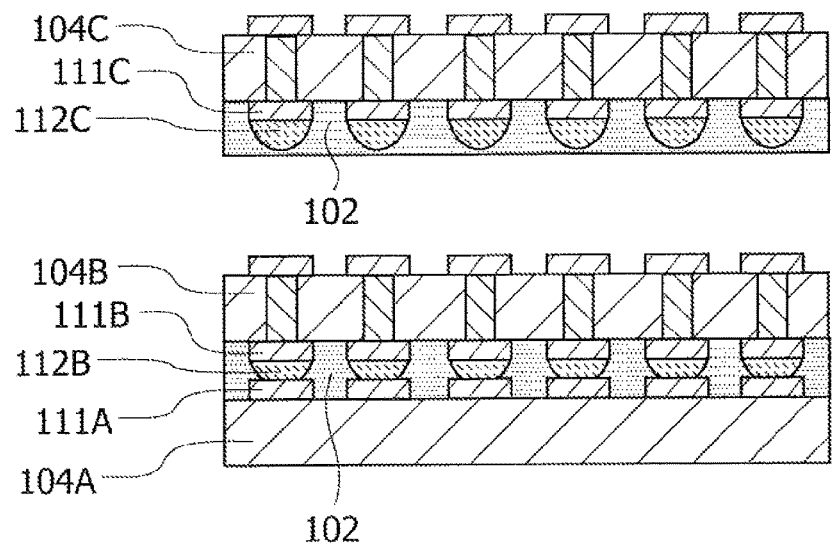

LAMINATED SEMICONDUCTOR DEVICE AND MANUFACTURING METHOD OF LAMINATED SEMICONDUCTOR DEVICE

CROSS-REFERENCE TO RELATED APPLICATION

This application is based upon and claims the benefit of priority of the prior Japanese Patent Application No. 2016-6203, filed on Jan. 15, 2016, the entire contents of which are incorporated herein by reference.

FIELD

An embodiment relates to a laminated semiconductor and a manufacturing method of a laminated semiconductor.

BACKGROUND

With the increase in data volume and the increase in processing speed, a CPU (Central Processing Unit) and a memory of a server or a supercomputer have been improved in performance. A shorter transmission distance between the CPU and the memory increases the speed of the signal transmission in the server, and enhances the performance of the server. By using a laminated semiconductor device in which plural semiconductor chips are laminated, plural memories are disposed near the CPU, resulting in the enhancement of the performance of the server.

When an under-fill is filled into the spaces among the plural laminated semiconductor chips after the plural semiconductor chips are laminated, the under-fill is not sufficiently filled in some cases, because the spaces of the plural laminated semiconductor chips are narrow. Therefore, the case of using a Non-conductive Film (NCF) technique instead of an under-fill technique has increased. As illustrated in FIG. 22, after an NCF 102 is attached on a wafer 101, the dicing is performed using a dicing blade 103. The wafer 101 is segmented, and thereby, a semiconductor chip 104 on which the NCF 102 is formed is manufactured.

As illustrated in FIG. 23, when the plural semiconductor chips are laminated, a semiconductor chip 104B is heated and compressed, using a heating head 120 of a semiconductor mounting apparatus such as a flip chip bonder. The heat transfers to the NCF 102, and the viscosity of the NCF 102 decreases. In the state where the viscosity of the NCF 102 has decreased, terminals 111B and solders 112B of the semiconductor chip 104B put pressure on the NCF 102, and thereby, the solders 112B break through the NCF 102. Terminals 111A of a semiconductor chip 104A and the terminals 111B of the semiconductor chip 104B are jointed through the solders 112B of the semiconductor chip 104B, and thereby, the conduction and stiffness between the semiconductor chip 104A and the semiconductor chip 104B are secured.

[Patent document 1] Japanese Laid-open Patent Publication No. 2015-18893

[Patent document 2] Japanese Laid-open Patent Publication No. 2014-203868

SUMMARY

A laminated semiconductor device includes: three or more semiconductor chips that are laminated; resins that are disposed among the semiconductor chips, the resins softening by heating; and support members that are disposed among the semiconductor chips and that contacts the adjacent semiconductor chips, the support members deforming by external force when a temperature of the support members reaching a predetermined temperature.

A manufacturing method of a laminated semiconductor device includes: laminating at least three semiconductor chips; and heating and compressing at least one of the semiconductor chips, wherein resins and support members are disposed among the semiconductor chips, the resins softening by heating, the support members deforming by external force when a temperature of the support members reaching a predetermined temperature.

The object and advantages of the embodiments will be realized and attained by means of the elements and combinations particularly pointed out in the claims. It is to be understood that both the foregoing general description and the following detailed description are exemplary and explanatory and are not restrictive of the embodiments, as claimed.

BRIEF DESCRIPTION OF DRAWINGS

FIG. 20A is an explanatory diagram of a manufacturing method of a semiconductor chip according to the first embodiment and the second embodiment;

FIG. 20B is an explanatory diagram of the manufacturing method of the semiconductor chip according to the first embodiment and the second embodiment;

FIG. 21A is an explanatory diagram of the manufacturing method of the semiconductor chip according to the first embodiment and the second embodiment;

FIG. 21B is an explanatory diagram of the manufacturing method of the semiconductor chip according to the first embodiment and the second embodiment;

FIG. 24 is an explanatory diagram of the joint method of the semiconductor chip;

DESCRIPTION OF EMBODIMENT

Hereinafter, embodiments will be described with reference to the drawings. The constitutions of the embodiments are examples, and the present application is not limited to the constitutions of the embodiments.

As illustrated in FIG. 24, when the plural semiconductor chips 104 between which the NCF 102 is formed are laminated, the alignment of the semiconductor chip 104B is performed, and the solder joint by heating and compressing is performed. After the connection between the semiconductor chip 104A and the semiconductor chip 104B, the alignment of a third-layer semiconductor chip 104C and the solder joint by heating and compressing are performed. In this case, the control of the heating and compressing is rigorously performed, in order to ensure the solder joint and enhance the voidless property of the NCF 102. When pressure is put on the NCFs 102 in a state where the temperature of the NCFs 102 does not sufficiently increase and the viscosity of the NCFs 102 does not decrease, the solders 112B, 112C are not able to break through the NCFs 102, or voids remain in the NCFs 102, in some cases.

Since the alignment, the solder joint and the like are performed for each layer of the laminated semiconductor device, the mounting takt (mounting time) increases. For example, the mounting takt is calculated by the following (1).

Mounting *takt*=(Chip conveyance time+Alignment time+Solder joint time)×Layer number (1)

Figure 25:
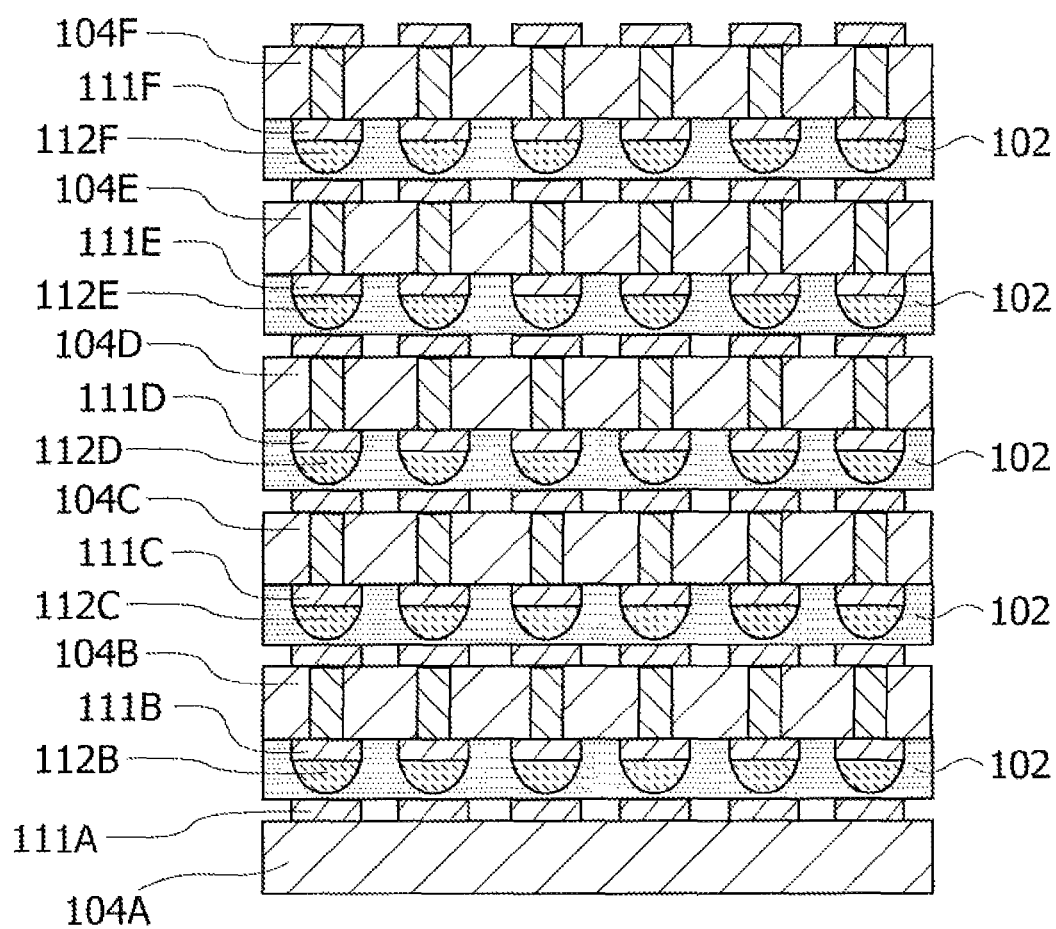
FIG. 25 is an explanatory diagram of a collective joint technique.
Figure 26:
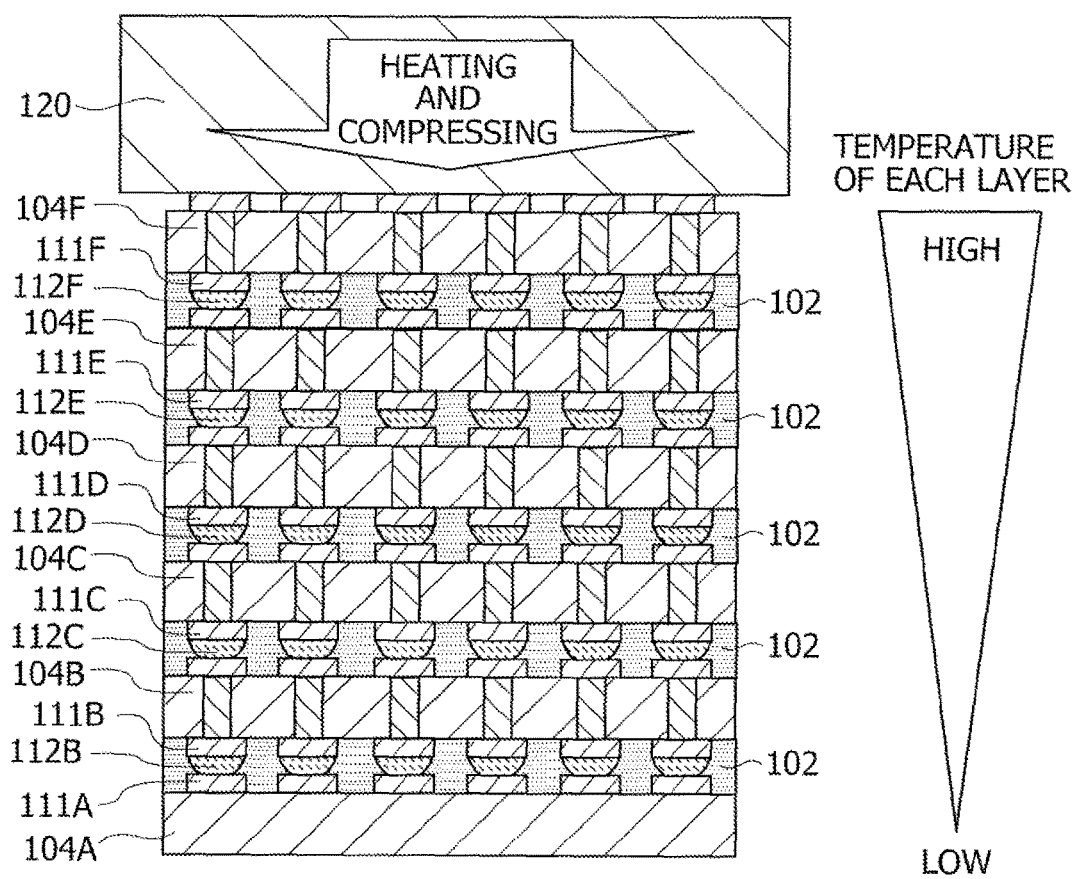
FIG. 26 is an explanatory diagram of the collective joint technique.

When the mounting takt increases, there is a problem of the increase in manufacturing cost. In order to suppress the mounting takt, there is a technique (collective joint technique) of laminating semiconductor chips 104A to 104F by temporary mounting while utilizing the tacking property (adhesiveness) of the NCF as illustrated in FIG. 25 and collectively performing the solder joints as illustrated in FIG. 26. The mounting takt of the collective joint technique is calculated by the following (2).

Mounting *takt*=(Chip conveyance time+Alignment time)×Layer number+Solder joint time (2)

In the case of the collective joint technique, as the layer number of the laminated semiconductor device increases, the temperature difference between upper layers and lower layers of the laminated semiconductor device increases, because it is hard for the heat to transfer from the heating head 120 to the lower layers of the laminated semiconductor device. Therefore, the temperature differs for each layer of the laminated semiconductor device. In some cases, for example, the temperature of the NCF 102 at a lower layer of the laminated semiconductor device does not sufficiently increase, and the viscosity of the NCF 102 does not decrease. Accordingly, in some cases, there is made a difference in joint quality (solder joint property, presence or absence of voids, reliability and the like) for each layer of the laminated semiconductor device.

First Embodiment

Figure 1:
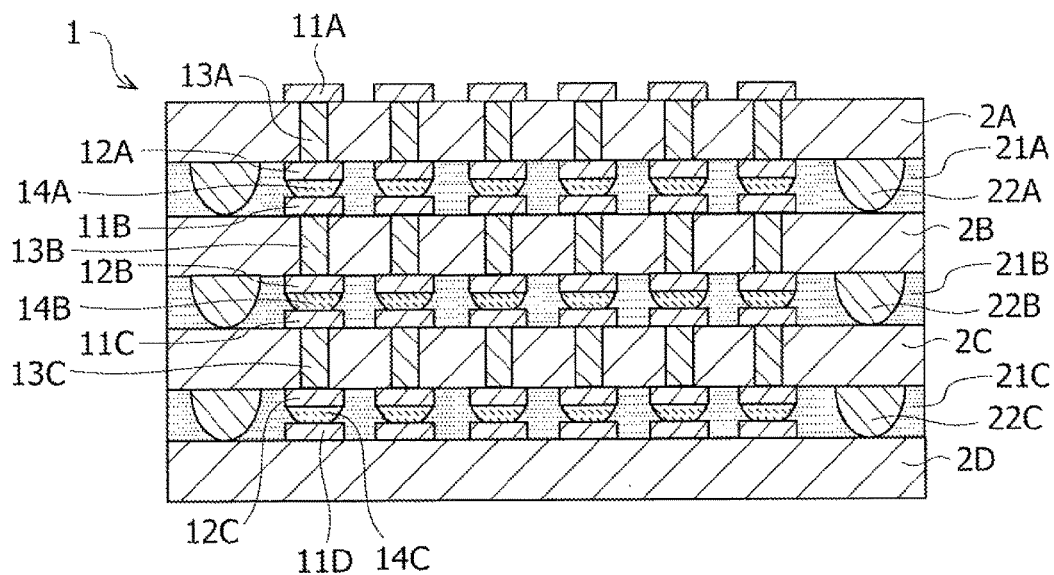
FIG. 1 a cross-sectional diagram of a laminated semiconductor device according to a first embodiment.

FIG. 1 is a cross-sectional diagram of a laminated semiconductor device (laminated chip) 1 according to a first embodiment. The laminated semiconductor device 1, for example, is a laminated memory. In the laminated semiconductor device 1, plural semiconductor chips 2 (2A to 2D) are laminated. The semiconductor chip 2A includes plural terminals 11A, plural terminals 12A, plural vias 13A, and plural solders 14A. The terminals 11A and the terminals 12A are electrically connected through the vias 13A that penetrate the semiconductor chip 2A. The semiconductor chip 2B includes plural terminals 11B, plural terminals 12B, plural vias 13B, and plural solders 14B. The terminal 11B and the terminal 12B are electrically connected through the vias 13B that penetrate the semiconductor chip 2B. The terminals 12A of the semiconductor chip 2A and the terminals 11B of the semiconductor chip 2B are jointed through the solders 14A.

The semiconductor chip 2C includes plural terminals 11C, plural terminals 12C, plural vias 13C, and plural solders 14C. The terminals 11C and the terminals 12C are electrically connected through the vias 13C that penetrate the semiconductor chip 2C. The terminals 12B of the semiconductor chip 2B and the terminals 11C of the semiconductor chip 2C are jointed through the solders 14C. The semiconductor chip 2D includes plural terminals 11D. The terminals 12C of the semiconductor chip 2C and the terminals 11D of the semiconductor chip 2D are jointed through the solders 14C. The vias 13A to 13C are called Through Silicon Vias (TSVs) also.

An example of the material of the terminals 11A to 11D, 12A to 12C and the vias 13A to 13C is Cu (copper). An example of the material of the solders 14A to 14C is Sn (tin) or an alloy containing Sn. A reinforcement resin 21A is disposed between the semiconductor chip 2A and the semiconductor chip 2B. A reinforcement resin 21B is disposed between the semiconductor chip 2B and the semiconductor chip 2C. A reinforcement resin 21C is disposed between the semiconductor chip 2C and the semiconductor chip 2D.

In the reinforcement resins 21A to 21C, the viscosity changes by temperature change. The reinforcement resins 21A to 21C harden at normal temperature, and soften by heating. The reinforcement resins 21A to 21C may be thermoplastic resins that soften by heating and thereafter harden by cooling. The reinforcement resins 21A to 21C may be thermosetting resins that soften by heating and thereafter harden by further heating. The reinforcement resins 21A to 21C, for example, are NCFs. The reinforcement resins 21A to 21C may be Non-conductive Pastes (NCPs). The reinforcement resins 21A to 21C are each an example of the resin.

Plural standoffs 22A are disposed between the semiconductor chip 2A and the semiconductor chip 2B. FIG. 1 illustrates an example in which the plural standoffs 22A are disposed, but one standoff 22A may be disposed. That is, at least one standoff 22A may be disposed between the semiconductor chip 2A and the semiconductor chip 2B. The standoff 22A is buried in the reinforcement resin 21A while contacting the adjacent semiconductor chips 2A, 2B. The standoff 22A is not electrically connected with the semiconductor chips 2A, 2B. The standoff 22A may be disposed at a peripheral portion of the semiconductor chip 2A, or may be disposed at a central portion of the semiconductor chip 2A. The standoff 22A is an example of the support member.

Plural standoffs 22B are disposed between the semiconductor chip 2B and the semiconductor chip 2C. FIG. 1 illustrates an example in which the plural standoffs 22B are disposed, but one standoff 22B may be disposed. That is, at least one standoff 22B may be disposed between the semiconductor chip 2B and the semiconductor chip 2C. The standoff 22B is buried in the reinforcement resin 21B while contacting the adjacent semiconductor chips 2B, 2C. The standoff 22B is not electrically connected with the semiconductor chips 2B, 2C. The standoff 22B may be disposed at a peripheral portion of the semiconductor chip 2B, or may be disposed at a central portion of the semiconductor chip 2B. The standoff 22B is an example of the support member.

Plural standoffs 22C are disposed between the semiconductor chip 2C and the semiconductor chip 2D. FIG. 1 illustrates an example in which the plural standoffs 22C are disposed, but one standoff 22C may be disposed. That is, at least one standoff 22C may be disposed between the semiconductor chip 2C and the semiconductor chip 2D. The standoff 22C is buried in the reinforcement resin 21C while contacting the adjacent semiconductor chips 2C, 2D. The standoff 22C is not electrically connected with the semiconductor chips 2C, 2D. The standoff 22C may be disposed at a peripheral portion of the semiconductor chip 2C, or may be disposed at a central portion of the semiconductor chip 2C. The standoff 22C is an example of the support member.

The standoffs 22A to 22C deform by external force when reaching a predetermined temperature. The predetermined temperature is higher than the softening temperature of the reinforcement resins 21A to 21C. The standoffs 22A to 22C have a spherical shape, a rectangular shape or a cylindrical shape. The standoffs 22A to 22C are solders or elastic bodies.

In the first embodiment, the semiconductor chips 2A to 2D are laminated by temporary mounting while utilizing the tacking property of the reinforcement resins 21A to 21C, and the solder joints of the layers of the laminated semiconductor device 1 are sequentially performed. A manufacturing method of the laminated semiconductor device 1 according to the first embodiment will be described with reference to FIG. 2 to FIG. 5.

Figure 2:
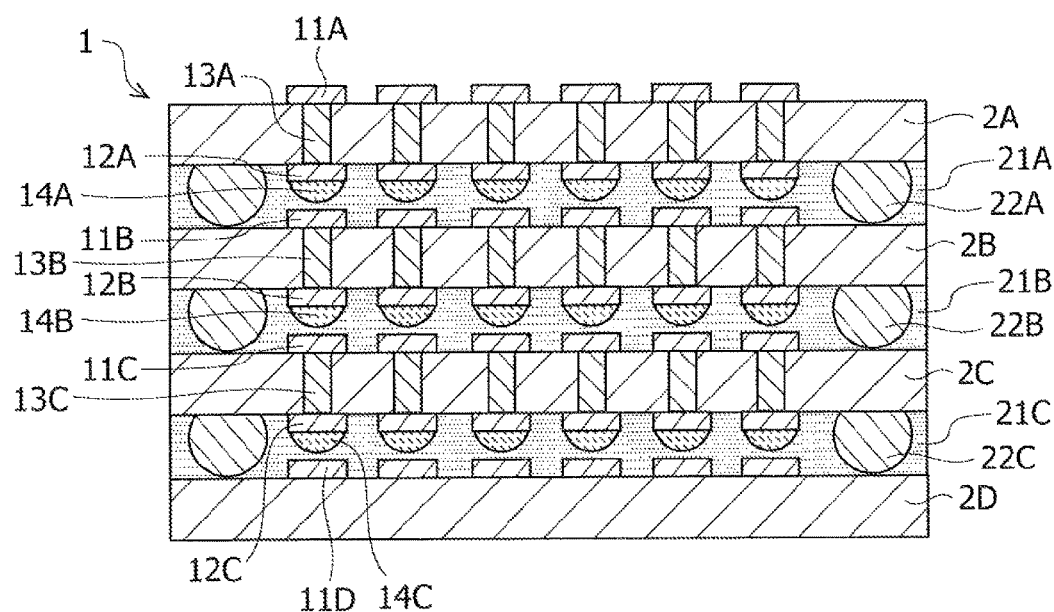
FIG. 2 is an explanatory diagram of a manufacturing method of the laminated semiconductor device according to the first embodiment.

First, as illustrated in FIG. 2, the semiconductor chips 2A to 2D are laminated by temporary mounting. In this case, the semiconductor chip 2D is placed on a stage (not illustrated), and the semiconductor chip 2C is disposed on the semiconductor chip 2D. Further, the semiconductor chip 2B is disposed on the semiconductor chip 2C, and the semiconductor chip 2A is disposed on the semiconductor chip 2B. The solders 14A of the semiconductor chip 2A do not contact the terminals 11B of the semiconductor chip 2B, the solders 14B of the semiconductor chip 2B do not contact the terminals 11C of the semiconductor chip 2C, and the solders 14C of the semiconductor chip 2C do not contact the terminals 11D of the semiconductor chip 2D.

Figure 3:
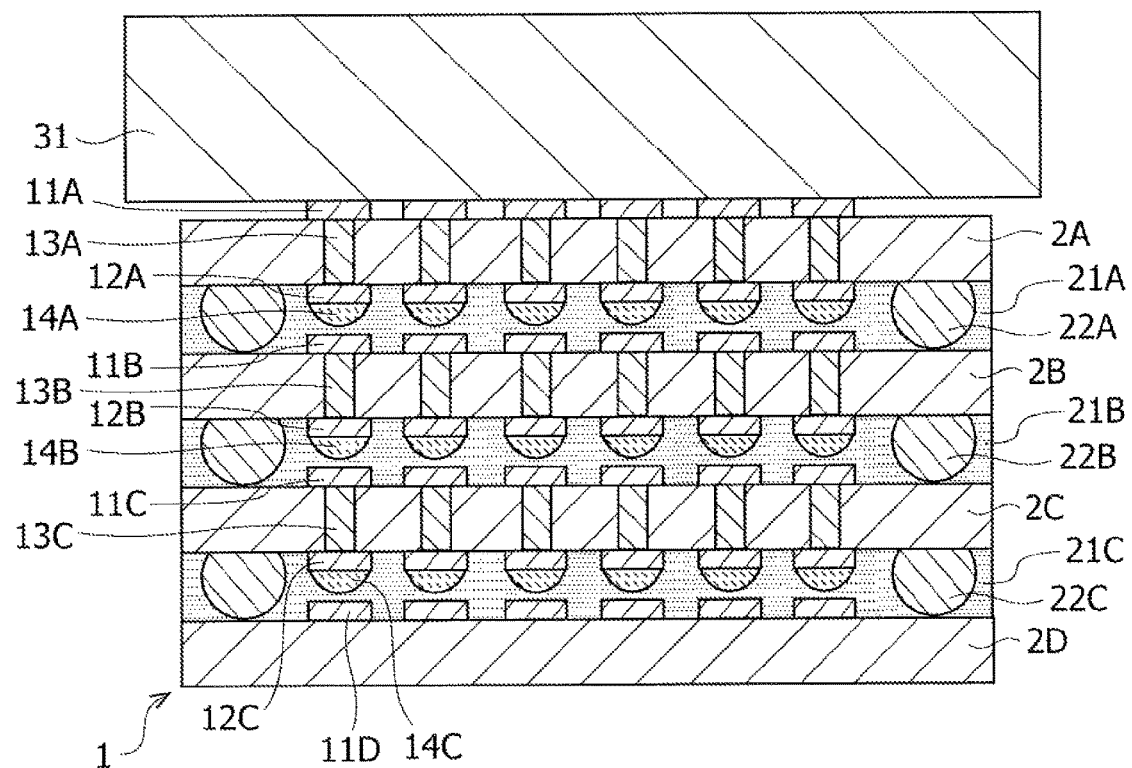
FIG. 3 is an explanatory diagram of the manufacturing method of the laminated semiconductor device according to the first embodiment.

Next, as illustrated in FIG. 3, a head 31 included in a semiconductor mounting apparatus such as a flip chip bonder is disposed on the laminated semiconductor device 1, and the laminated semiconductor device 1 is heated and compressed. In this case, the semiconductor chip 2A, which is the topmost layer of the laminated semiconductor device 1, is heated and compressed, using the head 31. The head 31 is called a heating head or a compressing and heating head also. The head 31 includes a heater (heating mechanism), which is not illustrated. The heating and compressing of the semiconductor chip 2A may be started simultaneously, or the compressing of the semiconductor chip 2A may be started after the heating of the semiconductor chip 2A is started. From the head 31, heat is given to the semiconductor chip 2A. The heat transfers from the semiconductor chip 2A to the semiconductor chip 2B, the heat transfers from the semiconductor chip 2B to the semiconductor chip 2C, and the heat transfers from the semiconductor chip 2C to the semiconductor chip 2D.

Since the reinforcement resin 21A and the standoffs 22A are disposed between the semiconductor chip 2A and the semiconductor chip 2B, the heat transfers from the semiconductor chip 2A to the reinforcement resin 21A and the standoffs 22A. Further, the heat transfers from the semiconductor chip 2A to the semiconductor chip 2B through the reinforcement resin 21A and the standoffs 22A. When the temperature of the standoffs 22A does not reach the predetermined temperature, the standoffs 22A do not deform, and therefore, the standoffs 22A support the semiconductor chip 2A. Accordingly, when the temperature of the standoffs 22A does not reach the predetermined temperature, the semiconductor chip 2A does not come down and the reinforcement resin 21A is hardly compressed, even if the semiconductor chip 2A is compressed.

Figure 4:
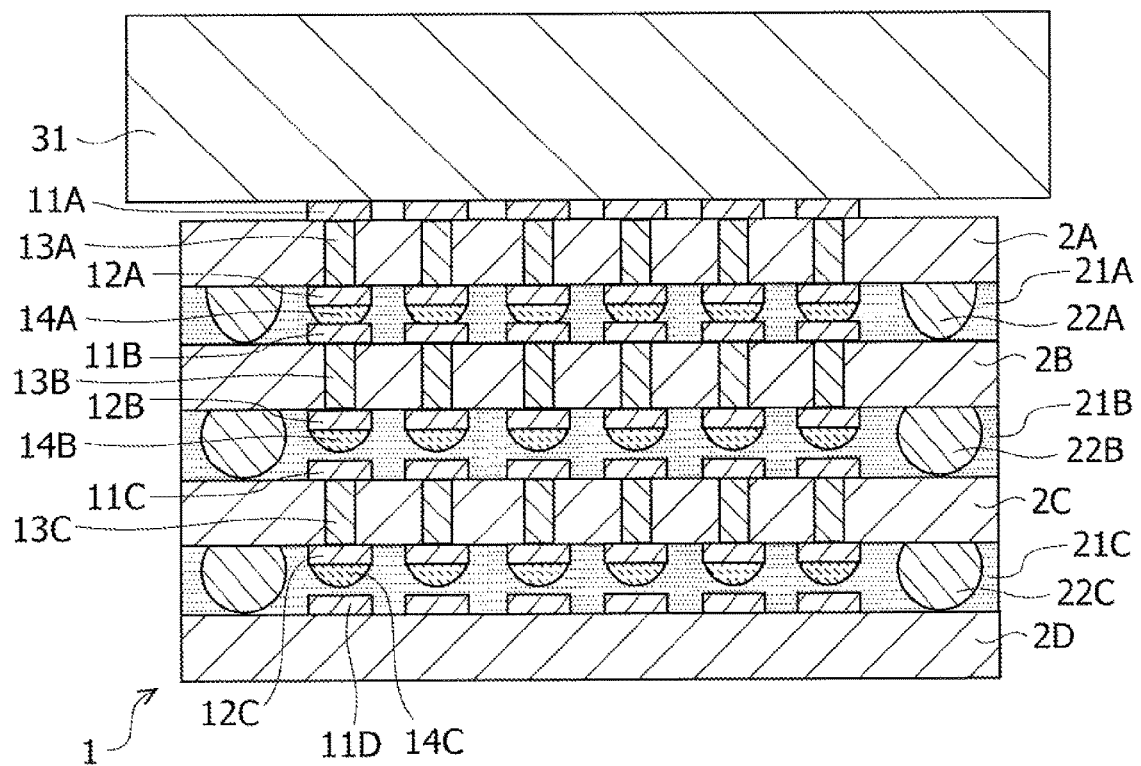
FIG. 4 is an explanatory diagram of the manufacturing method of the laminated semiconductor device according to the first embodiment.

When a certain time has elapsed after the heating of the semiconductor chip 2A is started, the temperature of the standoffs 22A reaches the predetermined temperature. As illustrated in FIG. 4, when the temperature of the standoffs 22A reaches the predetermined temperature, the pressure put on the semiconductor chip 2A transfers to the standoffs 22A through the semiconductor chip 2A, and thereby, the standoffs 22A deform. Since the standoffs 22A deform and the height of the standoffs 22A decreases, the semiconductor chip 2A comes down, and the reinforcement resin 21A is compressed. When the temperature of the standoffs 22A reaches the predetermined temperature, the reinforcement resin 21A has been sufficiently heated. Therefore, the viscosity of the reinforcement resin 21A has decreased, and the reinforcement resin 21A has softened. Accordingly, when the standoffs 22A deform and the reinforcement resin 21A is compressed, the reinforcement resin 21A has softened.

Since the semiconductor chip 2A comes down, the solders 14A of the semiconductor chip 2A break through the reinforcement resin 21A, and the solders 14A come in contact with the terminals 11B of the semiconductor chip 2B. When a certain time has elapsed after the solders 14A come in contact with the terminals 11B of the semiconductor chip 2B, the temperature of the solders 14A reaches the melting point, and the solders 14A melt. Since the solders 14A melt, the terminals 12A of the semiconductor chip 2A and the terminals 11B of the semiconductor chip 2B are jointed through the solders 14A. When the terminals 12A of the semiconductor chip 2A and the terminals 11B of the semiconductor chip 2B have been jointed, the heat transfers from the semiconductor chip 2A to the semiconductor chip 2B through the terminals 11B, 12A, the solders 14A, the reinforcement resin 21A and the standoffs 22A.

At the time when the solders 14A come in contact with the terminals 11B of the semiconductor chip 2B, the heat has not sufficiently transferred to the semiconductor chip 2B. Alternatively, at the time when the terminals 12A of the semiconductor chip 2A and the terminals 11B of the semiconductor chip 2B are jointed, the heat has not sufficiently transferred to the semiconductor chip 2B. Therefore, the solders 14B of the semiconductor chip 2B have not melted, and the reinforcement resin 21B disposed between the semiconductor chip 2B and the semiconductor chip 2C has not softened.

Since the reinforcement resin 21B and the standoffs 22B are disposed between the semiconductor chip 2B and the semiconductor chip 2C, the heat transfers from the semiconductor chip 2B to the reinforcement resin 21B and the standoffs 22B. Further, the heat transfers from the semiconductor chip 2B to the semiconductor chip 2C through the reinforcement resin 21B and the standoffs 22B. When the temperature of the standoffs 22B does not reach the predetermined temperature, the standoffs 22B do not deform, and therefore, the standoffs 22B support the semiconductor chip 2B. Accordingly, when the temperature of the standoffs 22B does not reach the predetermined temperature, the semiconductor chips 2A, 2B do not come down and the reinforcement resin 21B is hardly compressed, even if the semiconductor chip 2A is compressed.

Figure 5:
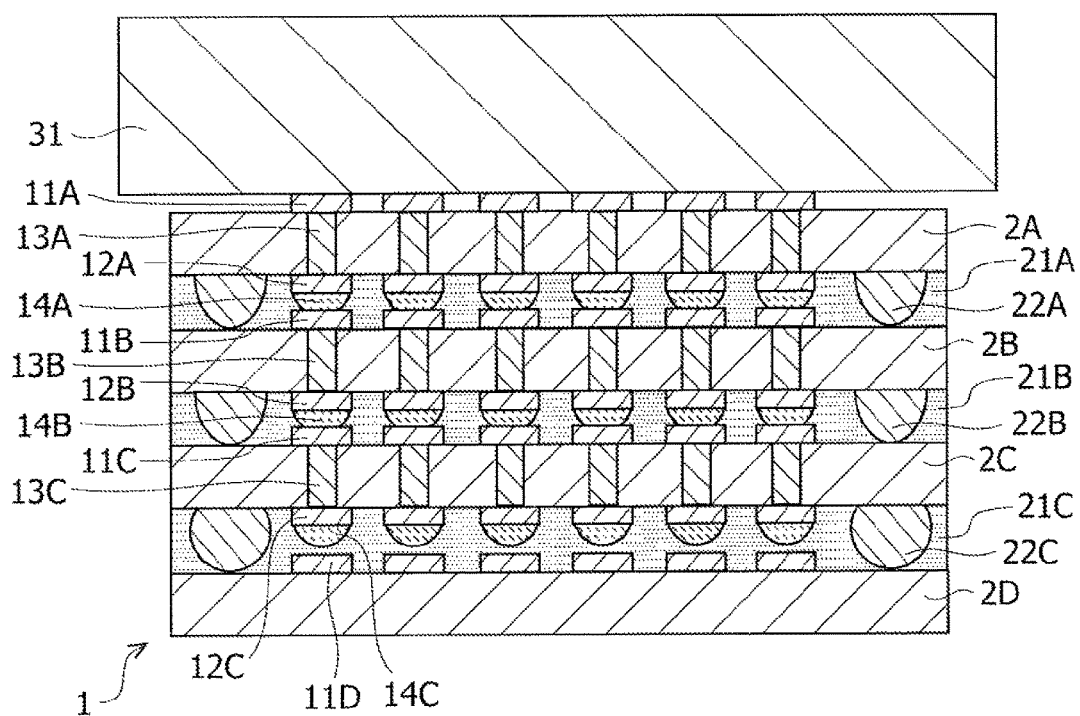
FIG. 5 is an explanatory diagram of the manufacturing method of the laminated semiconductor device according to the first embodiment.

When a certain time has elapsed after the heat transfers from the semiconductor chip 2A to the semiconductor chip 2B, the temperature of the standoffs 22B reaches the predetermined temperature. As illustrated in FIG. 5, when the temperature of the standoffs 22B reaches the predetermined temperature, the pressure put on the semiconductor chip 2A transfers to the standoffs 22B through the semiconductor chips 2A, 2B, and thereby, the standoffs 22B deform. Since the standoffs 22B deform and the height of the standoffs 22B decreases, the semiconductor chips 2A, 2B come down, and the reinforcement resin 21B is compressed. When the temperature of the standoffs 22B reaches the predetermined temperature, the reinforcement resin 21B has been sufficiently heated. Therefore, the viscosity of the reinforcement 21B has decreased, and the reinforcement resin 21B has softened. Accordingly, when the standoffs 22B deform and the reinforcement resin 21B is compressed, the reinforcement resin 21B has softened.

Since the semiconductor chips 2A, 2B come down, the solders 14B of the semiconductor chip 2B break through the reinforcement resin 21B, and the solders 14B come in contact with the terminals 11C of the semiconductor chip 2C. When a certain time has elapsed after the solders 14B come in contact with the terminals 11C of the semiconductor chip 2C, the temperature of the solders 14B reaches the melting point, and the solders 14B melt. Since the solders 14B melt, the terminals 12B of the semiconductor chip 2B and the terminals 11C of the semiconductor chip 2C are jointed through the solders 14B. When the terminals 12B of the semiconductor chip 2B and the terminals 11C of the semiconductor chip 2C have been jointed, the heat transfers from the semiconductor chip 2B to the semiconductor chip 2C through the terminals 11C, 12B, the solders 14B, the reinforcement resin 21B and the standoffs 22B.

At the time when the solders 14B come in contact with the terminals 11C of the semiconductor chip 2C, the heat has not sufficiently transferred to the semiconductor chip 2C. Alternatively, at the time when the terminals 12B of the semiconductor chip 2B and the terminals 11C of the semiconductor chip 2C are jointed, the heat has not sufficiently transferred to the semiconductor chip 2C. Therefore, the solders 14C of the semiconductor chip 2C have not melted, and the reinforcement resin 21C disposed between the semiconductor chip 2C and the semiconductor chip 2D has not softened.

Since the reinforcement resin 21C and the standoffs 22C are disposed between the semiconductor chip 2C and the semiconductor chip 2D, the heat transfers from the semiconductor chip 2C to the reinforcement resin 21C and the standoffs 22C. Further, the heat transfers from the semiconductor chip 2C to the semiconductor chip 2D through the reinforcement resin 21C and the standoffs 22C. When the temperature of the standoffs 22C does not reach the predetermined temperature, the standoffs 22C do not deform, and therefore, the standoffs 22C support the semiconductor chip 2C. Accordingly, when the temperature of the standoffs 22C does not reach the predetermined temperature, the semiconductor chips 2A to 2C come down and the reinforcement resin 21C is hardly compressed, even if the semiconductor chip 2A is compressed.

Figure 6:
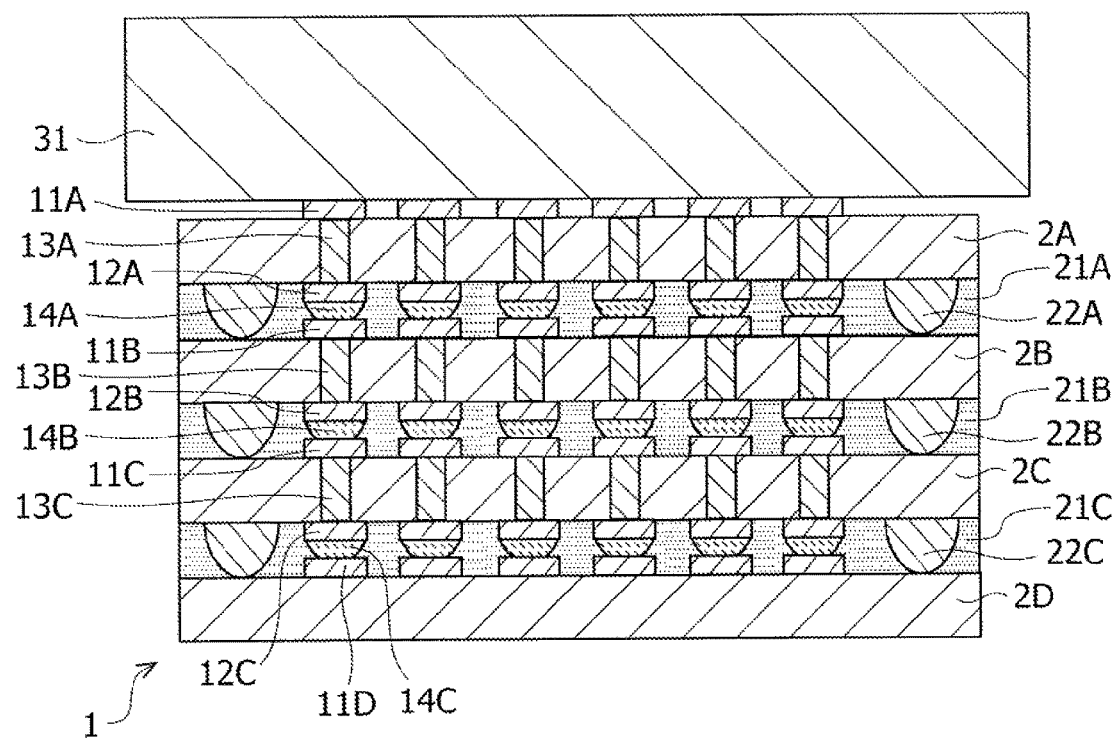
FIG. 6 is an explanatory diagram of the manufacturing method of the laminated semiconductor device according to the first embodiment.

When a certain time has elapsed after the heat transfers from the semiconductor chip 2B to the semiconductor chip 2C, the temperature of the standoffs 22C reaches the predetermined temperature. As illustrated in FIG. 6, when the temperature of the standoffs 22C reaches the predetermined temperature, the pressure put on the semiconductor chip 2A transfers to the standoffs 22C through the semiconductor chips 2A to 2C, and thereby, the standoffs 22C deform. Since the standoffs 22C deform and the height of the standoffs 22C decreases, the semiconductor chips 2A to 2C come down, and the reinforcement resin 21C is compressed. When the temperature of the standoffs 22C reaches the predetermined temperature, the reinforcement resin 21C has been sufficiently heated. Therefore, the viscosity of the reinforcement resin 21C has decreased, and the reinforcement resin 21C has softened. Accordingly, when the standoffs 22C deform and the reinforcement resin 21C is compressed, the reinforcement resin 21C has softened.

Since the semiconductor chips 2A to 2C come down, the solders 14C of the semiconductor chip 2C break through the reinforcement resin 21C, and the solders 14C come in contact with the terminals 11D of the semiconductor chip 2D. When a certain time has elapsed after the solders 14C come in contact with the terminals 11D of the semiconductor chip 2D, the temperature of the solders 14C reaches the melting point, and the solders 14C melt. When the solders 14C melt, the terminals 12C of the semiconductor chip 2C and the terminals 11D of the semiconductor chip 2D are jointed through the solders 14C. Thus, the laminated semiconductor device 1 is manufactured.

Figure 7:
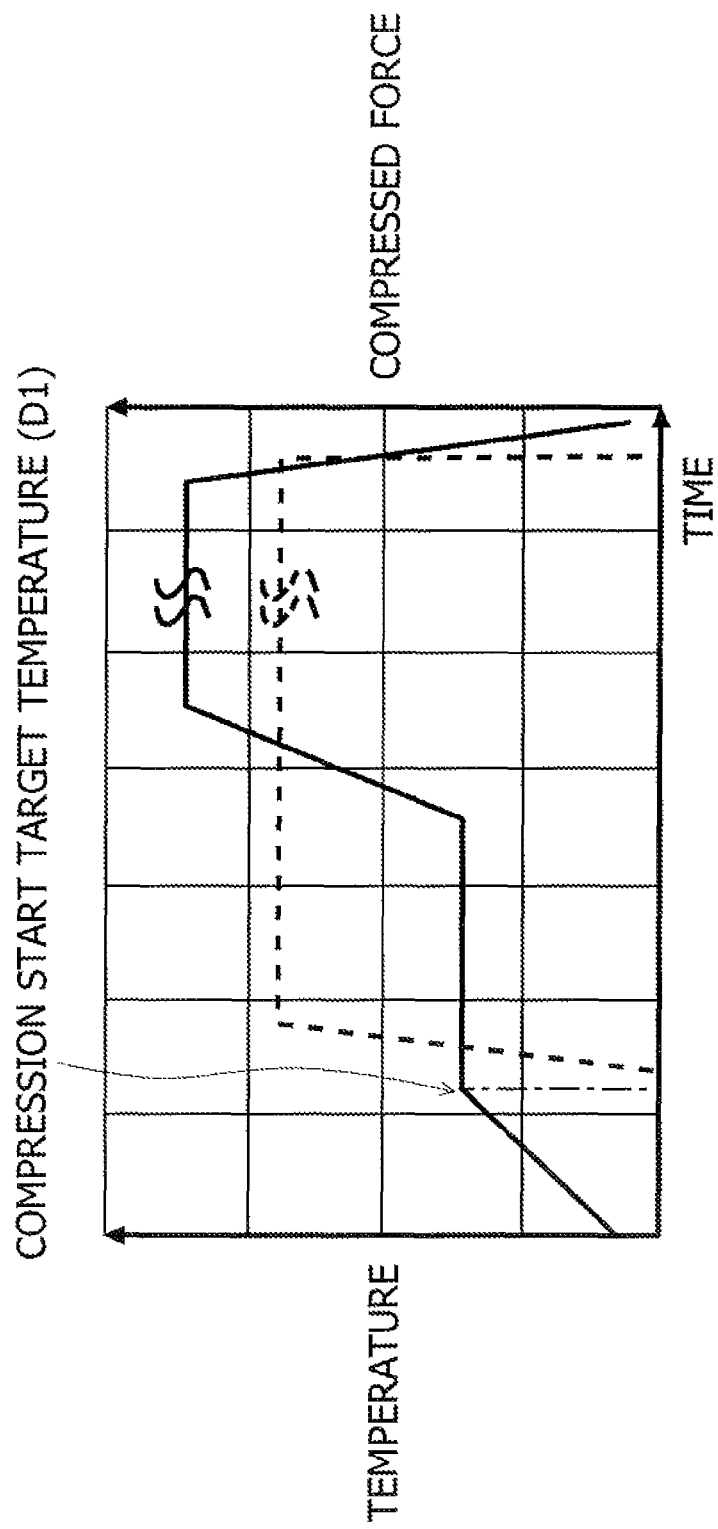
FIG. 7 is a diagram illustrating a profile of the temperature and compressed force of a reinforcement resin according to the first embodiment.

FIG. 7 is a diagram illustrating a profile of the temperature and compressed force of the reinforcement resin 21A according to the first embodiment. The ordinate in FIG. 7 indicates the temperature and compressed force of the reinforcement resin 21A, and the abscissa in FIG. 7 indicates the elapsed time after the heating of the laminated semiconductor device 1 is started. The solid line in FIG. 7 indicates the change in the temperature of the reinforcement resin 21A, and the dotted line in FIG. 7 indicates the change in the compressed force of the reinforcement resin 21A. As described with reference with FIG. 2 to FIG. 4, the reinforcement resin 21A is compressed after the temperature of the standoffs 22A reaches the predetermined temperature and the standoffs 22A deform. When the temperature of the standoffs 22A reaches the predetermined temperature, the reinforcement resin 21A has softened. Therefore, the compressed force of the reinforcement resin 21A increases after the temperature of the reinforcement resin 21A reaches a compression start target temperature (D1). The compression start target temperature (D1) is the temperature of the reinforcement resin 21A when the reinforcement resin 21A has softened.

Figure 8:
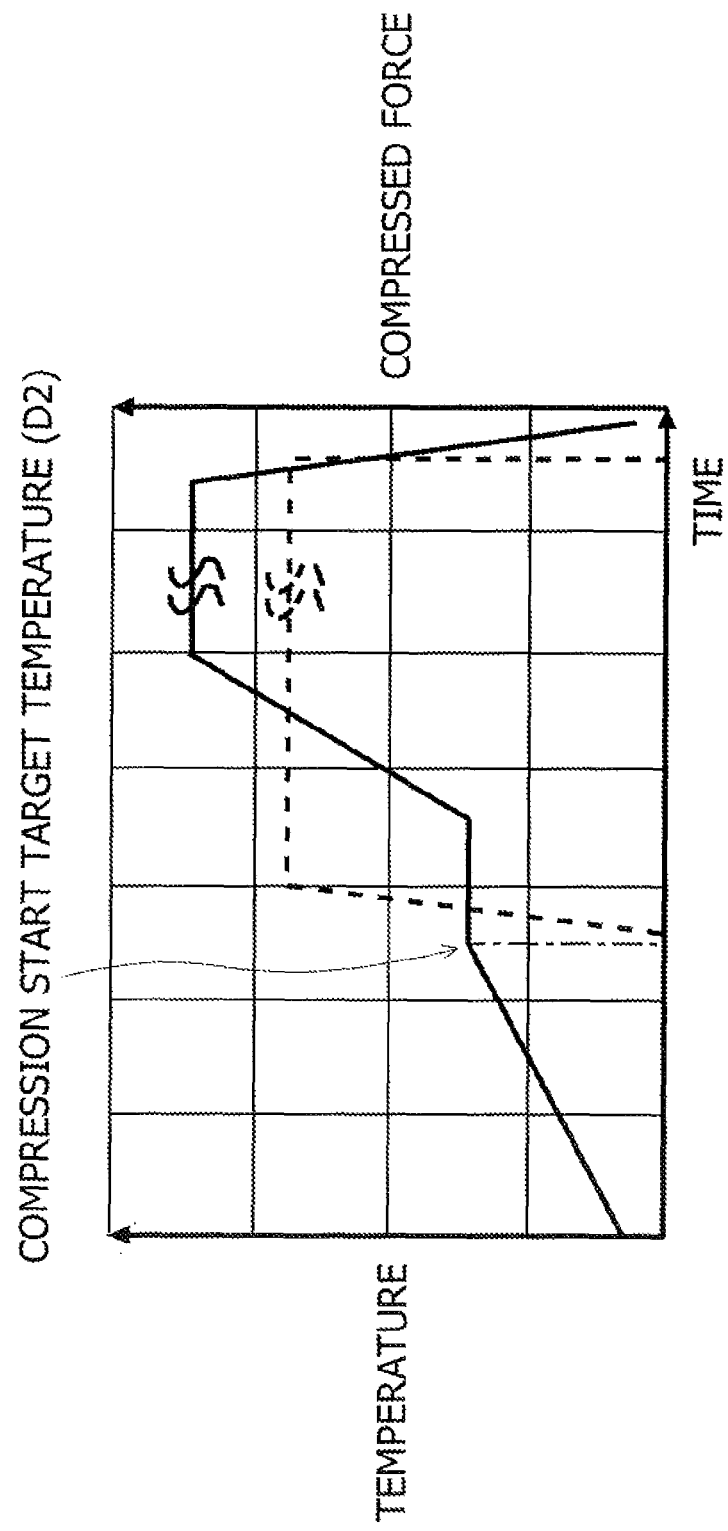
FIG. 8 is a diagram illustrating a profile of the temperature and compressed force of the reinforcement resin according to the first embodiment.

FIG. 8 is a diagram illustrating a profile of the temperature and compressed force of the reinforcement resin 21C according to the first embodiment. The ordinate in FIG. 8 indicates the temperature and compressed force of the reinforcement resin 21C, and the abscissa in FIG. 8 indicates the elapsed time after the heating of the laminated semiconductor device 1 is started. The solid line in FIG. 8 indicates the change in the temperature of the reinforcement resin 21C, and the dotted line in FIG. 8 indicates the change in the compressed force of the reinforcement resin 21C. As illustrated with reference to FIG. 6, the pressure is put on the reinforcement resin 21C after the temperature of the standoffs 22C reaches the predetermined temperature and the standoffs 22C deform. When the temperature of the standoffs 22C reaches the predetermined temperature, the reinforcement resin 21C has softened. Therefore, the compressed force of the reinforcement resin 21C increases after the temperature of the reinforcement resin 21C reaches a compression start target temperature (D2). The compression start target temperature (D2) is the temperature of the reinforcement resin 21C when the reinforcement resin 21C has softened. The compression start target temperature (D1) illustrated in FIG. 7 and the compression start target temperature (D2) illustrated in FIG. 8 are the same temperature. Thus, in the laminated semiconductor device 1 according to the first embodiment, the temperature of the reinforcement resin 21A when the reinforcement resin 21A is compressed and the temperature of the reinforcement resin 21C when the reinforcement resin 21C is compressed are equal.

In the laminated semiconductor 1 according to the first embodiment, the reinforcement resin 21A is compressed after the temperature of the standoffs 22A reaches the predetermined temperature and the standoffs 22A deform. When the reinforcement resin 21A is compressed, the reinforcement resin 21A has softened. Further, the reinforcement resin 21B is compressed after the temperature of the standoffs 22B reaches the predetermined temperature and the standoffs 22B deform. When the reinforcement resin 21B is compressed, the reinforcement resin 21B has softened. Moreover, the reinforcement resin 21C is compressed after the temperature of the standoffs 22C reaches the predetermined temperature and the standoffs 22C deform. When the reinforcement resin 21C is compressed, the reinforcement resin 21C has softened. Thus, in the laminated semiconductor device 1 according to the first embodiment, it is possible to compress the reinforcement resins 21A to 21C in the state where the reinforcement resins 21A to 21C have softened, and it is possible to even the joint state of each layer of the laminated semiconductor device 1. Thereby, it is possible to even the joint quality and joint reliability for each layer of the laminated semiconductor device 1. Further, it is possible to even the solder joint property for each layer of the laminated semiconductor device 1. Moreover, it is possible to inhibit the generation of voids in the reinforcement resins 21A to 21C, and to even the presence or absence of voids in the reinforcement resins 21A to 21C.

Figure 9:
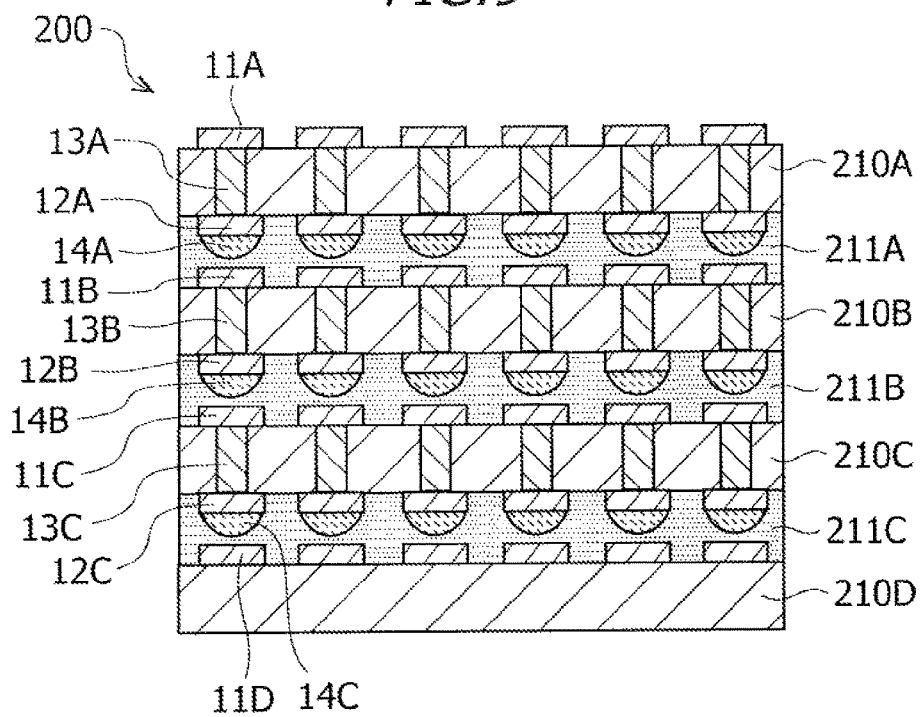
FIG. 9 is an explanatory diagram of a laminated semiconductor device according to a comparative example.
Figure 10:
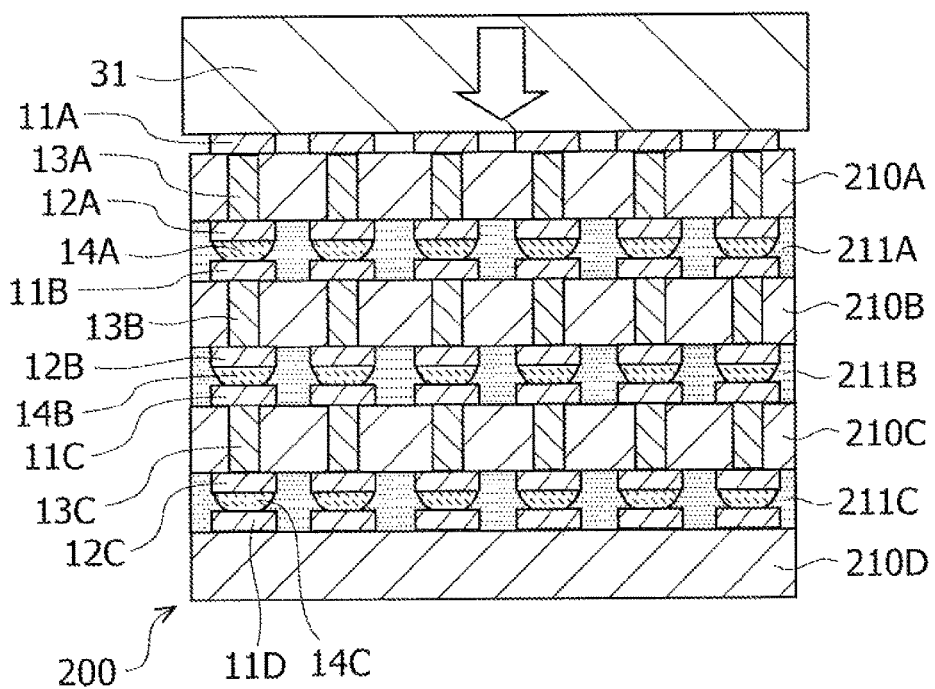
FIG. 10 is an explanatory diagram of the laminated semiconductor device according to the comparative example.

A solder joint according to a comparative example will be described with reference to FIG. 9 to FIG. 12. In the comparative example, semiconductor chips 210A to 210D are laminated by temporary mounting as illustrated in FIG. 9, and the solder joints of the layers of a laminated semiconductor device 200 are sequentially performed as illustrated in FIG. 10. In the laminated semiconductor device 200 according to the comparative example, a reinforcement resin 211A is disposed between the semiconductor chip 210A and the semiconductor chip 210B, a reinforcement resin 211B is disposed between the semiconductor chip 210B and the semiconductor chip 210C, and a reinforcement resin 211C is disposed between the semiconductor chip 210C and the semiconductor chip 210D. Further, in the laminated semiconductor device 200 according to the comparative example, the standoffs 22A to 22C are not disposed.

Figure 11:
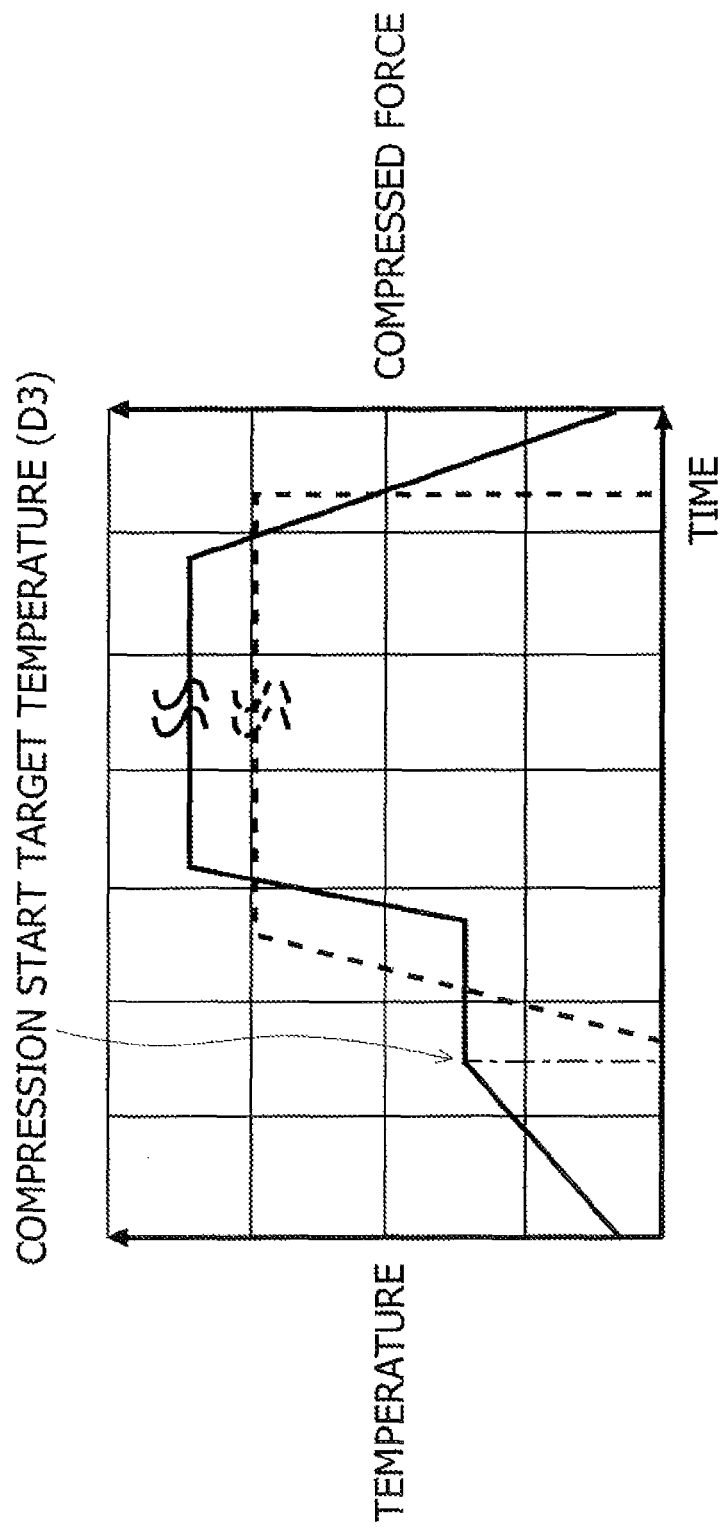
FIG. 11 is a diagram illustrating a profile of the temperature and compressed force of a reinforcement resin according to the comparative example.

FIG. 11 is a diagram illustrating a profile of the temperature and compressed force of the reinforcement resin 211A according to the comparative example. The ordinate in FIG. 11 indicates the temperature and compressed force of the reinforcement resin 211A, and the abscissa in FIG. 11 indicates the elapsed time after the heating of the laminated semiconductor device 200 is started. The solid line in FIG. 11 indicates the change in the temperature of the reinforcement resin 211A, and the dotted line in FIG. 11 indicates the change in the compressed force of the reinforcement resin 211A. In the comparative example, the head 31 is disposed on the laminated semiconductor device 200, and thereafter, the compressing of the laminated semiconductor device 200 is started after a certain time has elapsed since the start of the heating of the laminated semiconductor device 200. Therefore, the compressed force of the reinforcement resin 211A increases after the temperature of the reinforcement resin 211A reaches a compression start target temperature (D3). The compression start target temperature (D3) is the temperature of the reinforcement resin 211A when the reinforcement resin 211A has softened.

Figure 12:
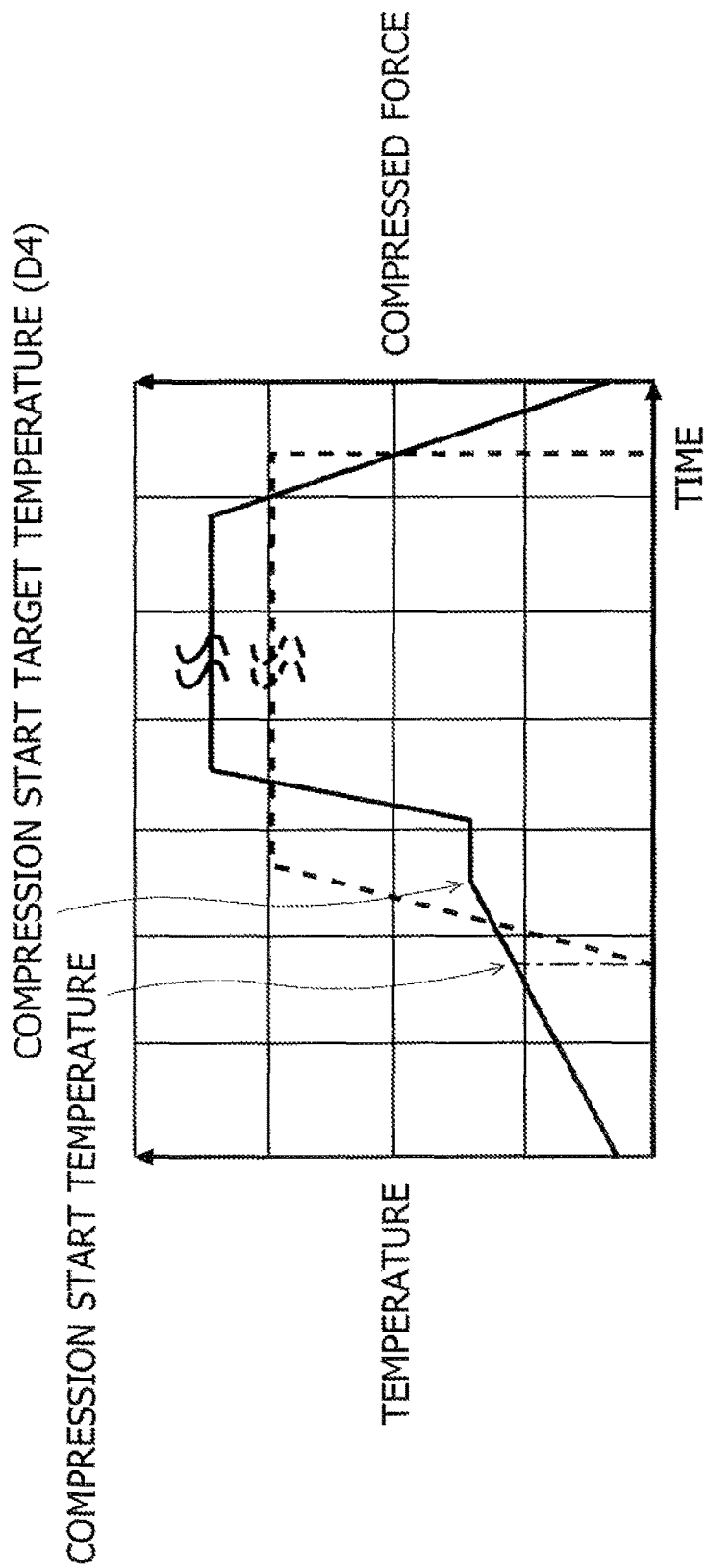
FIG. 12 is a diagram illustrating a profile of the temperature and compressed force of the reinforcement resin according to the comparative example.

FIG. 12 is a diagram illustrating a profile of the temperature and compressed force of the reinforcement resin 211C according to the comparative example. The ordinate in FIG. 12 indicates the temperature and compressed force of the reinforcement resin 211C, and the abscissa in FIG. 12 indicates the elapsed time after the heating of the laminated semiconductor device 200 is started. The solid line in FIG. 12 indicates the change in the temperature of the reinforcement resin 211C, and the dotted line in FIG. 12 indicates the change in the compressed force of the reinforcement resin 211C. In the comparative example, since the standoffs 22A and 22B are not disposed in the laminated semiconductor device 200, the reinforcement resin 211C has not been sufficiently heated and the reinforcement resin 211C has not softened, when the reinforcement resin 211C is compressed. Therefore, before the temperature of the reinforcement resin 211C reaches a compression start target temperature (D4), the compressing of the reinforcement resin 211C is started, and the compressed force of the reinforcement resin 211C increases. The compression start target temperature (D4) is the temperature of the reinforcement resin 211C when the reinforcement resin 211C has softened.

In the laminated semiconductor device 200 according to the comparative example, the temperature of the reinforcement resin 211A when the reinforcement resin 211A is compressed and the temperature of the reinforcement resin 211C when the reinforcement resin 211C is compressed are different. Accordingly, the viscosity of the reinforcement resin 211A when the reinforcement resin 211A is compressed and the viscosity of the reinforcement resin 211C when the reinforcement resin 211C is compressed are different. Therefore, the void removal behavior of the reinforcement resin 211A and the void removal behavior of the reinforcement resin 211C are different. Further, the layers of the laminated semiconductor device 200 are different in the fluid behavior of the reinforcement resins 211A to 211C around the terminals 11B to 11D, 12A to 12C. As a result, at the time of the solder joint, gaps are generated among the semiconductor chips 210A to 210D.

Figure 13A:
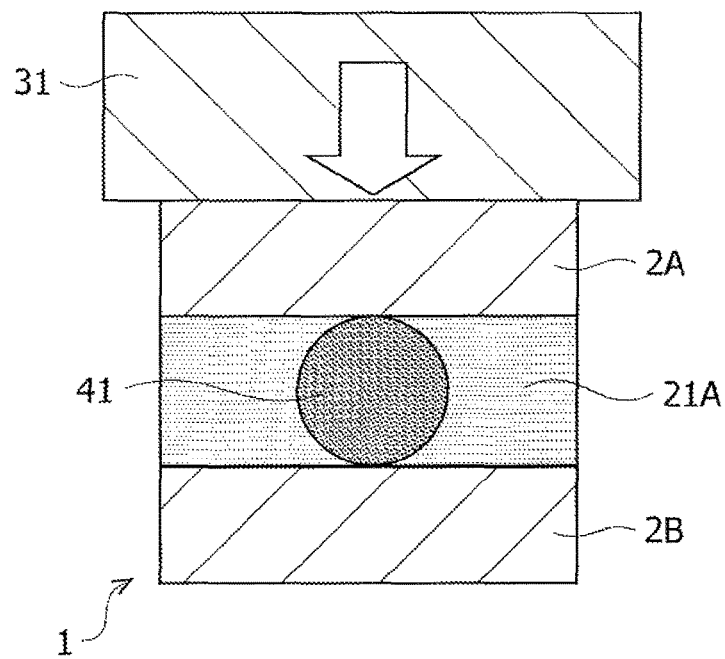
FIG. 13A is a partial cross-sectional diagram of a laminated semiconductor device.
Figure 13B:
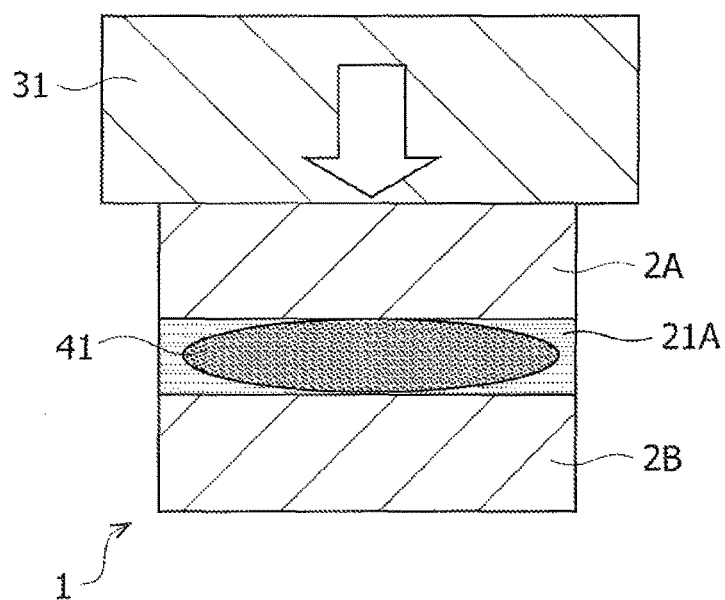
FIG. 13B is a partial cross-sectional diagram of the laminated semiconductor device.

FIG. 13 is a partial cross-sectional diagram of the laminated semiconductor device 1 for the case where the standoff 22A is a solder 41. When reaching nearly the melting point of the solder 41 or the melting point of the solder 41, the solder 41 melts, and deforms by external force. As illustrated in FIG. 13A, when the solder 41 has not melted, the solder 41 does not deform even if the semiconductor chip 2 is compressed by the head 31. As illustrated in FIG. 13B, after the solder 41 melts, the solder 41 deforms when the semiconductor chip 2A is compressed by the head 31. FIG. 13A and FIG. 13B illustrate a structure example for the case where the standoff 22A is the solder 41, but the standoffs 22B, 22C may be solders 41. The material of the solder 41 may be selected from Sn-40Bi-Cu—Ni (melting point 130° C.), Sn-58Bi (melting point 139° C.) and Sn48-In52 (melting point 119° C.).

Figure 14A:
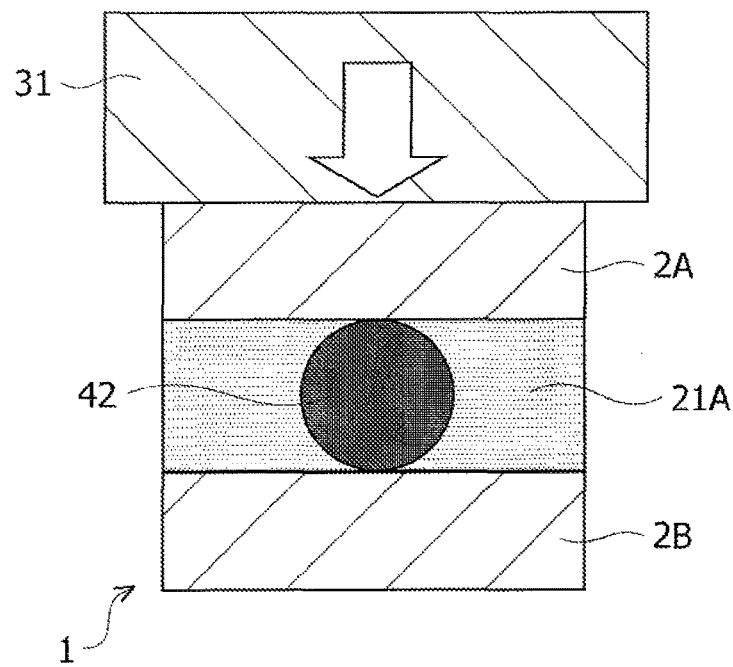
FIG. 14A is a partial cross-sectional diagram of a laminated semiconductor device.
Figure 14B:
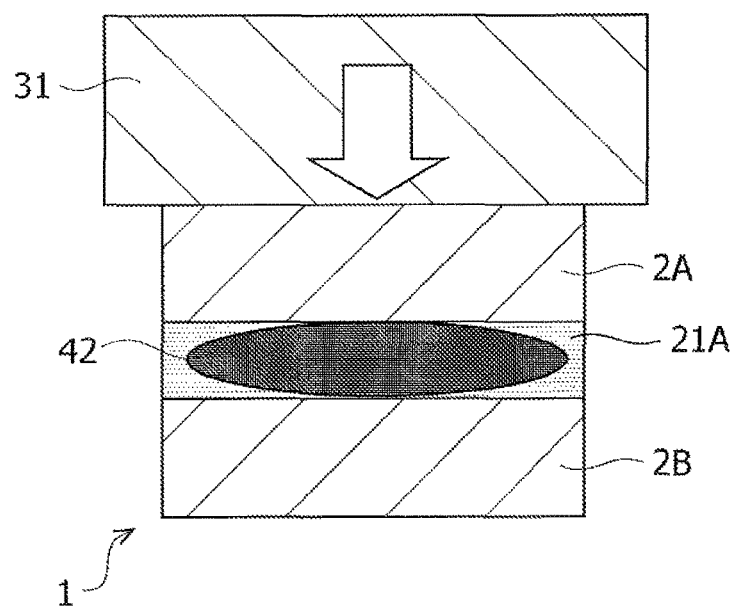
FIG. 14B is a partial cross-sectional diagram of the laminated semiconductor device.

FIG. 14 is a cross-sectional diagram of the laminated semiconductor device 1 for the case where the standoff 22A is an elastic body 42. The elastic body 42, for example, is a thermoplastic resin. In the elastic body 42, the elastic modulus changes by temperature change. The elastic body 42, whose elastic modulus decreases by temperature increase, deforms by external force when the elastic modulus reaches a predetermined value. As illustrated in FIG. 14A, when the elastic modulus of the elastic body 42 does not reach the predetermined value, the elastic body 42 does not deform even if the semiconductor chip 2A is compressed by the head 31. As illustrate in FIG. 14B, after the elastic modulus of the elastic body 42 reaches the predetermined value, the elastic body 42 deforms when the semiconductor chip 2A is compressed by the head 31. FIG. 14A and FIG. 14B illustrate a structure example for the case where the standoff 22A is the elastic body 42, but the standoffs 22B, 22C may be elastic bodies 42. Further, the standoffs 22A to 22C may have a structure in which the solder 41 covers the periphery of the elastic body 42.

Second Embodiment

A laminated semiconductor device 1 according to a second embodiment will be described. For the laminated semiconductor device 1 according to the second embodiment, the same reference characters as the first embodiment are assigned to the same constituent elements as the first embodiment, and the descriptions are omitted.

Figure 15:
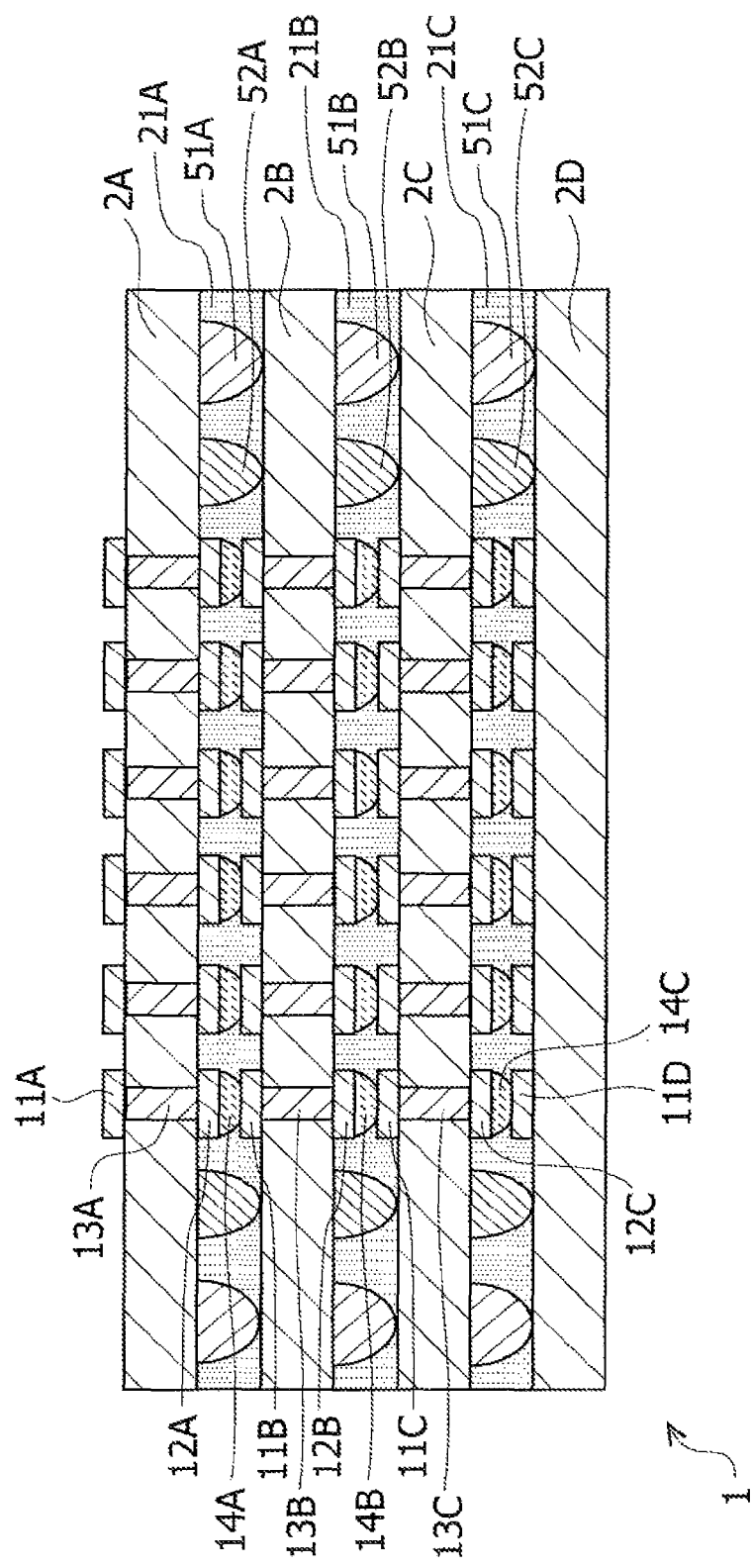
FIG. 15 is a cross-sectional diagram of a laminated semiconductor device.

FIG. 15 is a cross-sectional diagram of the laminated semiconductor device 1. Plural standoffs 51A and plural standoffs 52A are disposed between the semiconductor chip 2A and the semiconductor chip 2B. FIG. 15 illustrates an example in which the plural standoffs 51A are disposed, but one standoff 51A may be disposed. That is, at least one standoff 51A may be disposed between the semiconductor chip 2A and the semiconductor chip 2B. Further, FIG. 15 illustrates an example in which the plural standoffs 52A are disposed, but one standoff 52A may be disposed. That is, at least one standoff 52A may be disposed between the semiconductor chip 2A and the semiconductor chip 2B. The standoffs 51A, 52A are buried in the reinforcement resin 21A while contacting the adjacent semiconductor chips 2A, 2B. The standoffs 51A, 52A are not electrically connected with the semiconductor chips 2A, 2B. The standoffs 51A, 52A may be disposed at a peripheral portion of the semiconductor chip 2A, or may be disposed at a central portion of the semiconductor chip 2A. The standoff 51A is an example of the first support member. The standoff 52A is an example of the second support member.

Plural standoffs 51B and plural standoffs 52B are disposed between the semiconductor chip 2B and the semiconductor chip 2C. FIG. 15 illustrates an example in which the plural standoffs 51B are disposed, but one standoff 51B may be disposed. That is, at least one standoff 51B may be disposed between the semiconductor chip 2B and the semiconductor chip 2C. Further, FIG. 15 illustrates an example in which the plural standoffs 52B are disposed, but one standoff 52B may be disposed. That is, at least one standoff 52B may be disposed between the semiconductor chip 2B and the semiconductor chip 2C. The standoffs 51B, 52B are buried in the reinforcement resin 21B while contacting the adjacent semiconductor chips 2B, 2C. The standoffs 51B, 52B are not electrically connected with the semiconductor chips 2B, 2C. The standoffs 51B, 52B may be disposed at a peripheral portion of the semiconductor chip 2B, or may be disposed at a central portion of the semiconductor chip 2B. The standoff 51B is an example of the first support member. The standoff 52B is an example of the second support member.

Plural standoffs 51C and plural standoffs 52C are disposed between the semiconductor chip 2C and the semiconductor chip 2D. FIG. 15 illustrates an example in which the plural standoffs 51C are disposed, but one standoff 51C may be disposed. That is, at least one standoff 51C may be disposed between the semiconductor chip 2C and the semiconductor chip 2D. Further, FIG. 15 illustrates an example in which the plural standoffs 52C are disposed, but one standoff 52C may be disposed. That is, at least one standoff 52C may be disposed between the semiconductor chip 2C and the semiconductor chip 2D. The standoffs 51C, 52C are buried in the reinforcement resin 21C while contacting the adjacent semiconductor chips 2C, 2D. The standoffs 51C, 52C are not electrically connected with the semiconductor chips 2C, 2D. The standoffs 51C, 52C may be disposed at a peripheral portion of the semiconductor chip 2C, or may be disposed at a central portion of the semiconductor chip 2C. The standoff 51C is an example of the first support member. The standoff 52C is an example of the second support member.

The standoffs 51A to 51C deform by external force, when reaching a first predetermined temperature. The standoffs 52A to 52C deform by external force, when reaching a second predetermined temperature. The first predetermined temperature and the second predetermined temperature are different temperatures, and the first predetermined temperature is lower than the second predetermined temperature. The first predetermined temperature and the second predetermined temperature are higher than the softening temperature of the reinforcement resins 21A to 21C. The standoffs 51A to 51C, 52A to 52C have a spherical shape, a rectangular shape or a cylindrical shape. The standoffs 51A to 51C, 52A to 52C are solders or elastic bodies. The standoffs 51A to 51C, 52A to 52C may be solders 41 illustrated in FIG. 13. For example, the material of the standoffs 51A to 51C may be Sn48-In52 (melting point 119° C.), and the material of the standoffs 52A to 52C may be Sn-58Bi (melting point 139° C.). Further, the standoffs 51A to 51C, 52A to 52C may be elastic bodies 42 illustrated in FIG. 14.

Figure 16:
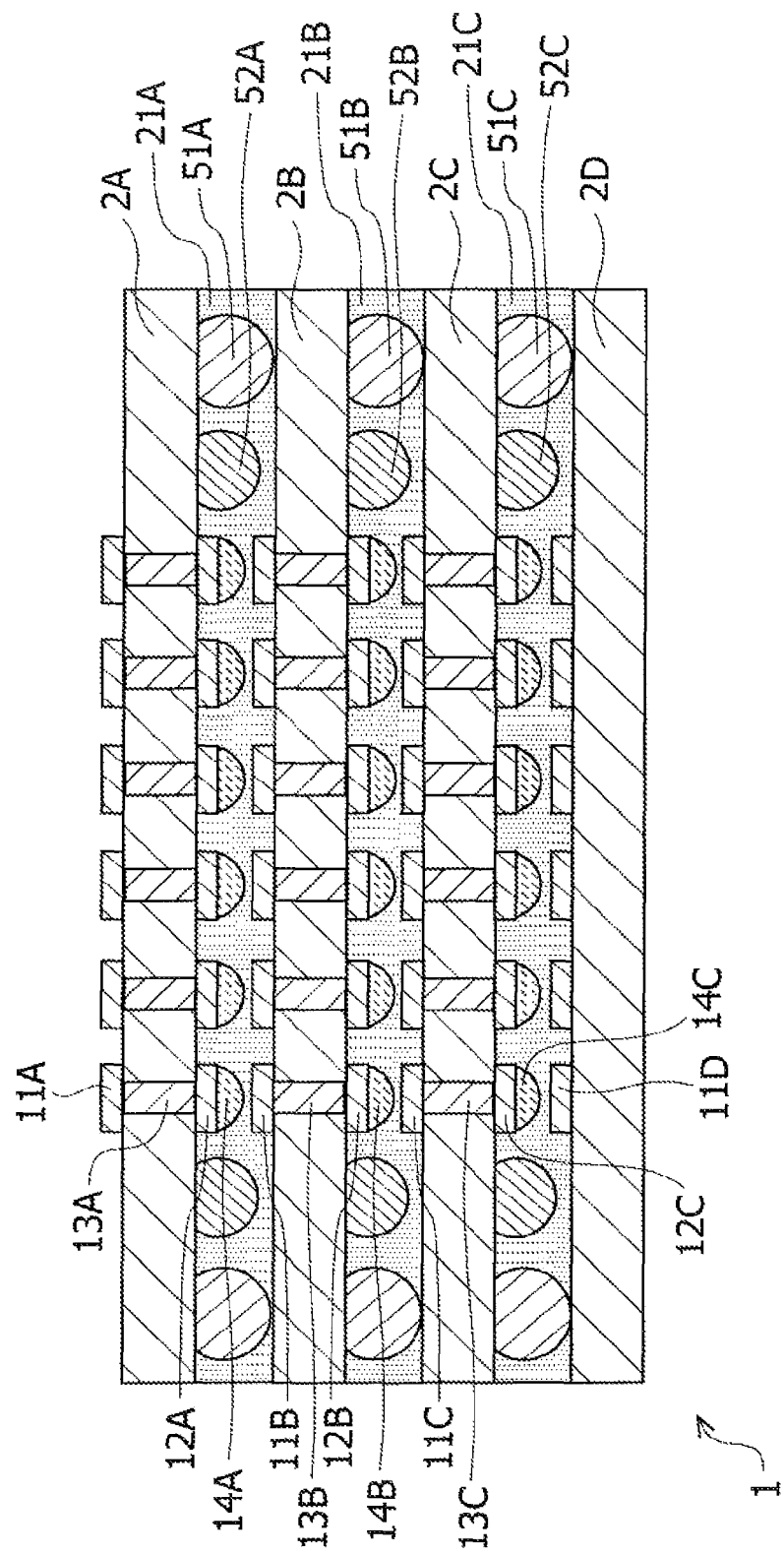
FIG. 16 is an explanatory diagram of a manufacturing method of a laminated semiconductor device according to a second embodiment.

A manufacturing method of the laminated semiconductor device 1 according to the second embodiment will be described with reference to FIG. 16 to FIG. 18. As illustrated in FIG. 16, the semiconductor chips 2A to 2D are laminated by temporary mounting. In this case, the semiconductor chip 2D is placed on a stage (not illustrated), and the semiconductor chip 2C is disposed on the semiconductor chip 2D. Further, the semiconductor chip 2B is disposed on the semiconductor chip 2C, and the semiconductor chip 2A is disposed on the semiconductor chip 2B. The solders 14A of the semiconductor chip 2A do not contact the terminals 11B of the semiconductor chip 2B, the solders 14B of the semiconductor chip 2B do not contact the terminals 11C of the semiconductor chip 2C, and the solders 14C of the semiconductor chip 2C do not contact the terminals 11D of the semiconductor chip 2D. The standoffs 52A do not contact the semiconductor chip 2B, the standoffs 52B do not contact the semiconductor chip 2C, and the standoffs 52C do not contact the semiconductor chip 2D. The height of the standoffs 51A to 51C is greater than the height of the standoffs 52A to 52C.

Figure 17:
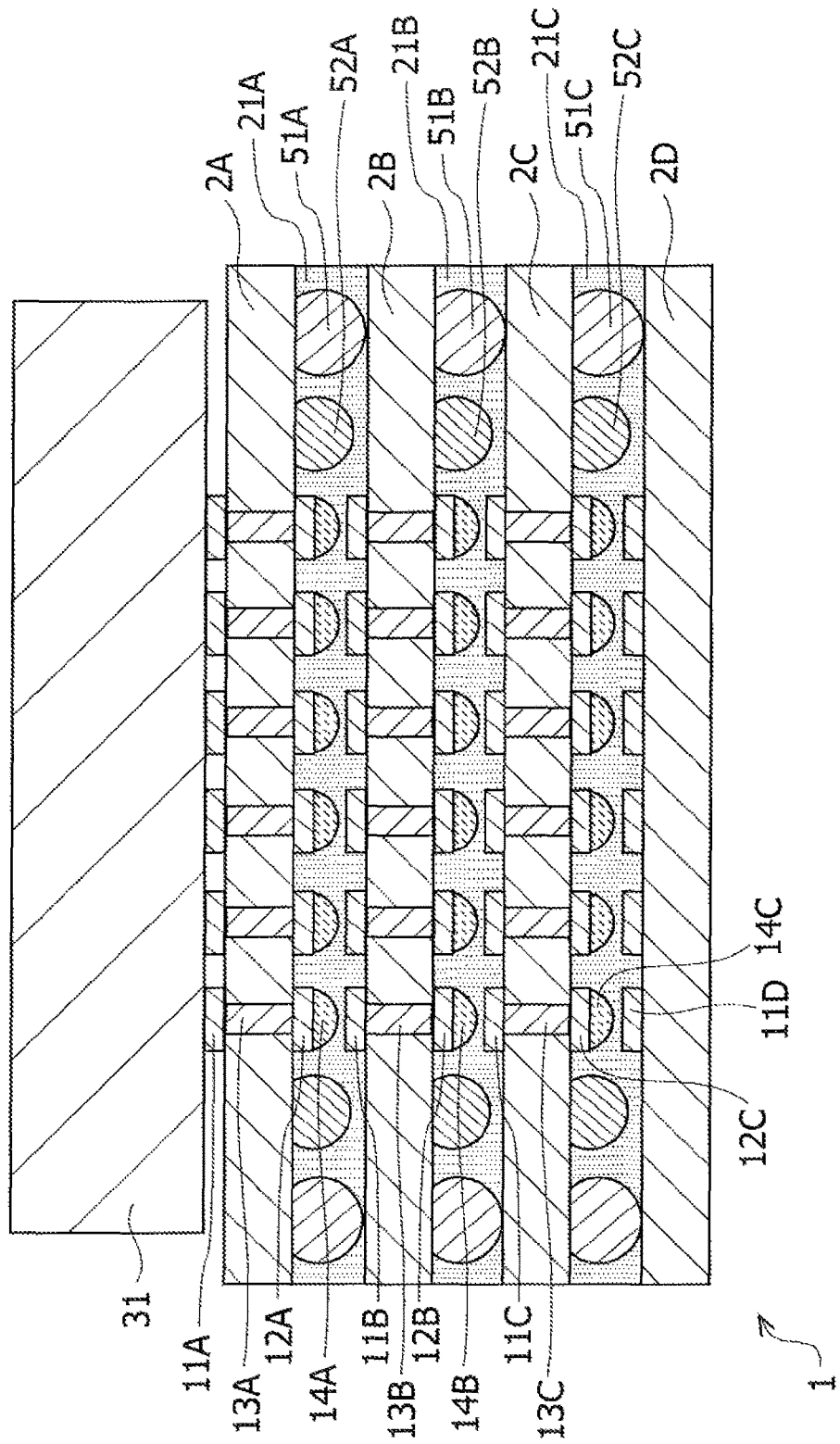
FIG. 17 is an explanatory diagram of the manufacturing method of the laminated semiconductor device according to the second embodiment.
Figure 18:
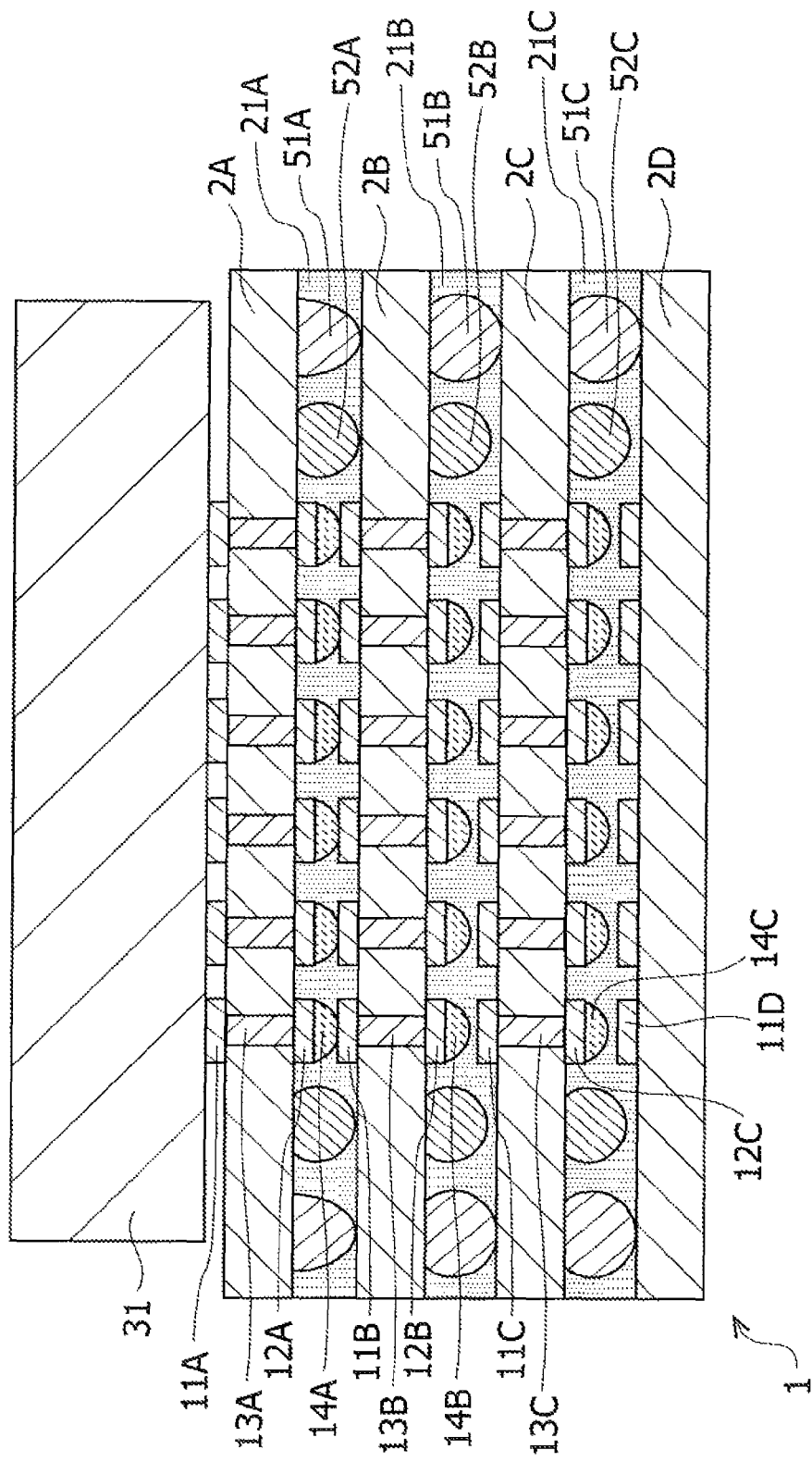
FIG. 18 is an explanatory diagram of the manufacturing method of the laminated semiconductor device according to the second embodiment.

Next, as illustrated in FIG. 17, the head 31 is disposed on the laminated semiconductor device 1, and the laminated semiconductor device 1 is compressed and heated. In this case, the semiconductor chip 2A, which is the topmost layer of the laminated semiconductor device 1, is heated and compressed, using the head 31. The heating and compressing of the semiconductor chip 2A may be started simultaneously, or the compressing of the semiconductor chip 2A may be started after the heating of the semiconductor chip 2A is started. From the head 31, heat is given to the semiconductor chip 2A. The heat transfers from the semiconductor chip 2A to the semiconductor chip 2B, the heat transfers from the semiconductor chip 2B to the semiconductor chip 2C, and the heat transfers from the semiconductor chip 2C to the semiconductor chip 2D.

Since the reinforcement resin 21A and the standoffs 51A, 52A are disposed between the semiconductor chip 2A and the semiconductor chip 2B, the heat transfers from the semiconductor chip 2A to the reinforcement resin 21A and the standoffs 51A, 52A. Further, the heat transfers from the semiconductor chip 2A to the semiconductor chip 2B through the reinforcement resin 21A and the standoffs 51A, 52A. When the temperature of the standoffs 51A does not reach the first predetermined temperature, the standoffs 51A do not deform, and therefore, the standoffs 51A support the semiconductor chip 2A. Accordingly, when the temperature of the standoffs 51A does not reach the first predetermined temperature, the semiconductor chip 2A does not come down and the reinforcement resin 21A is hardly compressed, even if the semiconductor chip 2A is compressed.

When a certain time has elapsed after the heating of the semiconductor chip 2A is started, the temperature of the standoffs 51A reaches the first predetermined temperature. As illustrated in FIG. 18, when the temperature of the standoffs 51A reaches the first predetermined temperature, the pressure put on the semiconductor chip 2A transfers to the standoffs 51A through the semiconductor chip 2A, and thereby, the standoffs 51A deform. Since the standoffs 51A deform and the height of the standoffs 51A decreases, the semiconductor chip 2A comes down, and the reinforcement resin 21A is compressed. When the temperature of the standoffs 51A reaches the first predetermined temperature, the reinforcement resin 21A has been sufficiently heated. Therefore, the viscosity of the reinforcement resin 21A has decreased, and the reinforcement resin 21A has softened. Accordingly, when the standoffs 51A deform and the reinforcement resin 21A is compressed, the reinforcement resin 21A has softened.

When the semiconductor chip 2A comes down, the distance between the semiconductor chip 2A and the semiconductor chip 2B decreases, and the standoffs 52A come in contact with the semiconductor chip 2B. In this case, the temperature of the standoffs 52A has not reached the second predetermined temperature, and the standoffs 52A have not deformed. Accordingly, until the temperature of the standoffs 52A reaches the second predetermined temperature after the standoffs 52A come in contact with the semiconductor chip 2B, the semiconductor chip 2A does not come down and the reinforcement resin 21A is hardly compressed, even if the semiconductor chip 2A is compressed.

Figure 19:
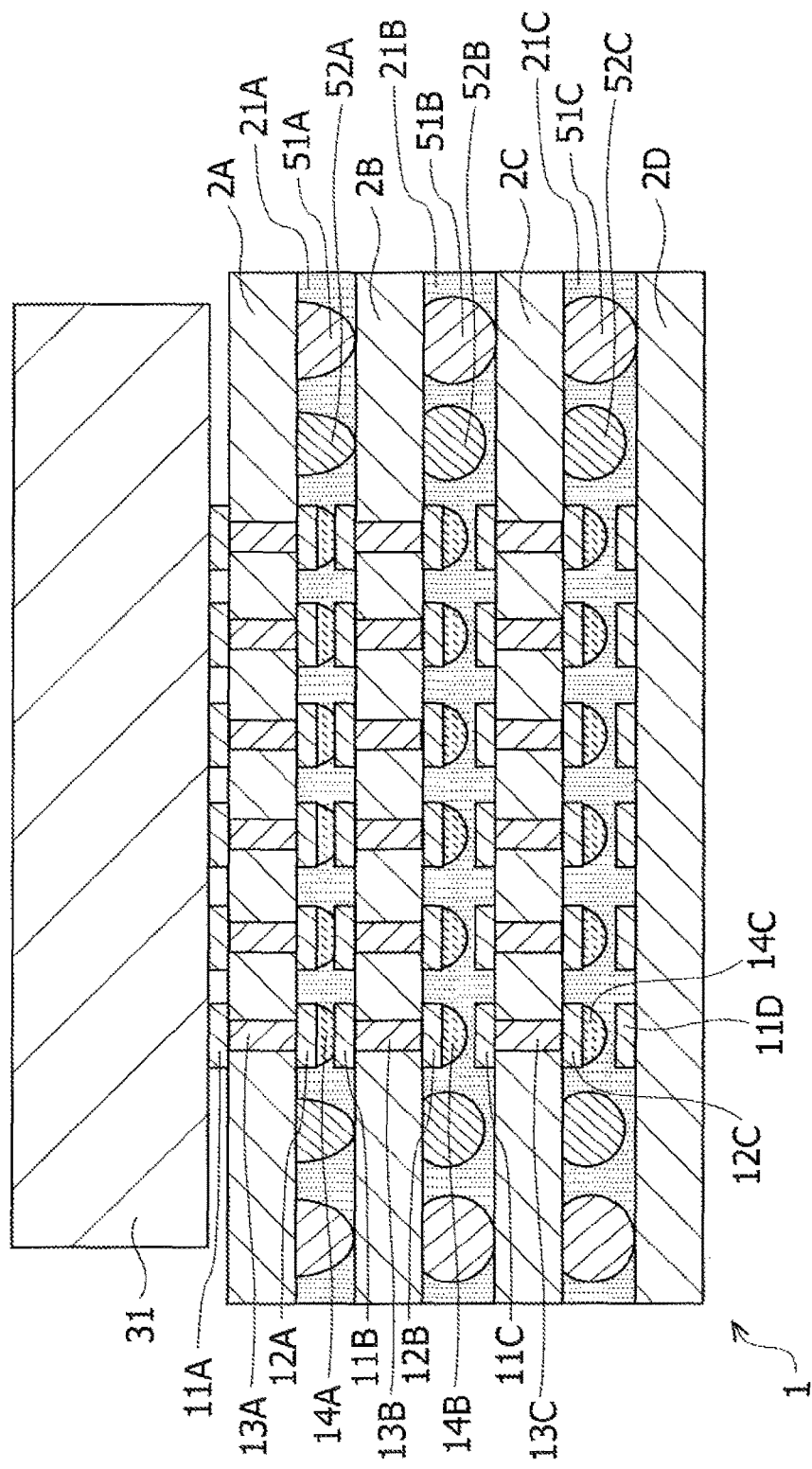
FIG. 19 is an explanatory diagram of the manufacturing method of the laminated semiconductor device according to the second embodiment.
Figure 22:
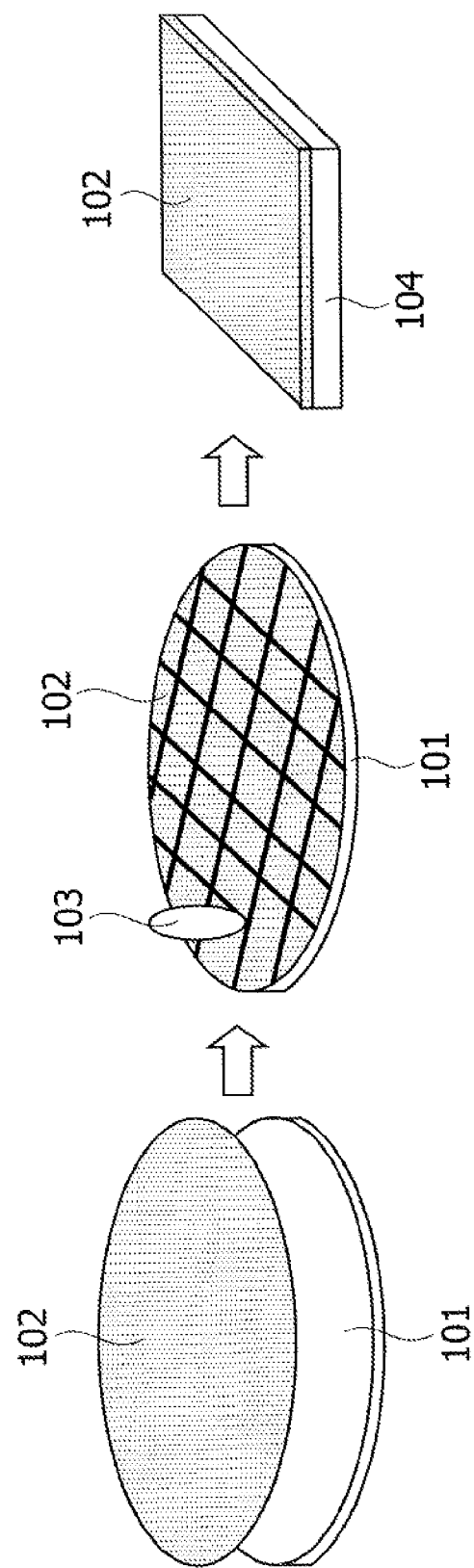
FIG. 22 is an explanatory diagram of a manufacturing method of a semiconductor chip.
Figure 23:
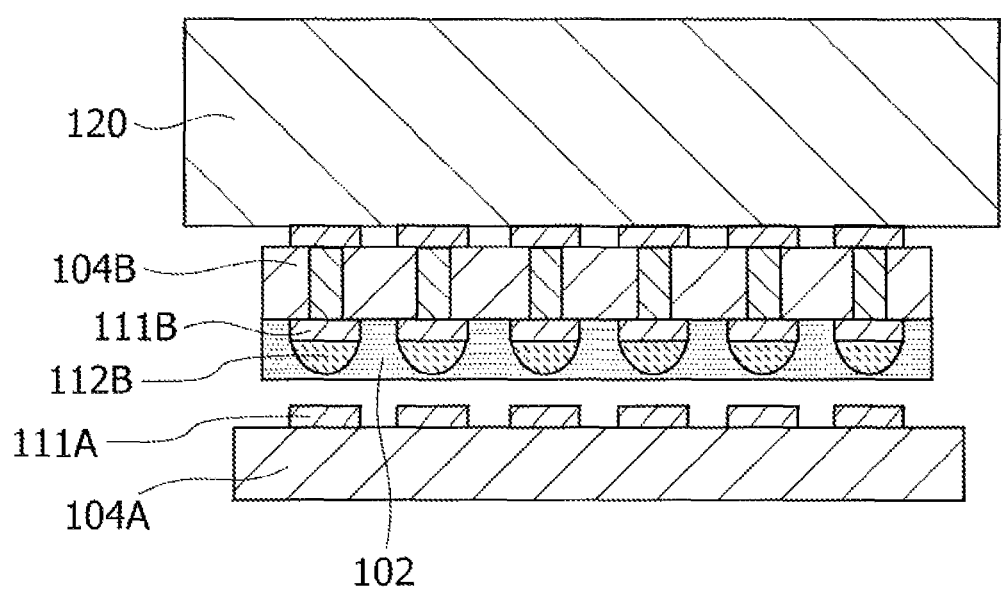
FIG. 23 is an explanatory diagram of a joint method of the semiconductor chip.

When a certain time has elapsed after the temperature of the standoffs 51A reaches the first predetermined temperature, the temperature of the standoffs 52A reaches the second predetermined temperature. As illustrated in FIG. 19, when the temperature of the standoffs 52A reaches the second predetermined temperature, the pressure put on the semiconductor chip 2A transfers to the standoffs 52A through the semiconductor chip 2A, and thereby, the standoffs 52A deform. The standoffs 52A deform, and the height of the standoffs 52A decreases. In addition, since the pressure put on the semiconductor chip 2A transfers to the standoffs 52A through the semiconductor chip 2A, the standoffs 52A further deform. Thereby, the semiconductor chip 2A further comes down, and the reinforcement resin 21A is compressed. The solders 14A of the semiconductor chip 2A break through the reinforcement resin 21A, and the solders 14A come in contact with the terminals 11B of the semiconductor chip 2B.

When a certain time has elapsed after the solders 14A come in contact with the terminals 11B of the semiconductor chip 2B, the temperature of the solders 14A reaches the melting point, and the solders 14A melt. Since the solders 14A melt, the terminals 12A of the semiconductor chip 2A and the terminals 11B of the semiconductor chip 2B are jointed through the solders 14A. For the solders 14B, 14C, the joint is performed similarly to the solders 14A.

According to the second embodiment, in addition to the effect of the first embodiment, it is possible to compress the reinforcement resin 21A when the temperature of the standoffs 51A reaches the first predetermined temperature, and to further compress the reinforcement resin 21A when the temperature of the standoffs 52A reaches the second predetermined temperature. Similarly, it is possible to compress the reinforcement resin 21B when the temperature of the standoffs 52B reaches the first predetermined temperature, and to further compress the reinforcement resin 21B when the temperature of the standoffs 52B reaches the second predetermined temperature. Moreover, similarly, it is possible to compress the reinforcement resin 21C when the temperature of the standoffs 52C reaches the first predetermined temperature, and to further compress the reinforcement resin 21C when the temperature of the standoffs 52C reaches the second predetermined temperature. Thus, according to the second embodiment, it is possible to compress the reinforcement resins 21A to 21C in a stepwise manner.

A manufacturing method of the semiconductor chip 2A according to the first embodiment and the second embodiment will be described with reference to FIG. 20A, FIG. 20B, FIG. 21A and FIG. 21B. Although the manufacturing method of the semiconductor chip 2A will be described herein, the same goes for manufacturing methods of the semiconductor chips 2B to 2D. First, as illustrated in FIG. 20A, a semiconductor wafer 3 in which plural terminals 11A, plural terminals 12A, plural vias 13A and plural solders 14A are formed is prepared. The semiconductor wafer 3, for example, is a silicon wafer. Next, as illustrated in FIG. 20B, plural standoffs 22A are formed on the semiconductor wafer 3. In the case where the standoffs 22A are solders 41, the standoffs 22A are formed on the semiconductor wafer 3, for example, by a plating method or a ball mounting method. Further, in the case where the standoffs 22A are thermoplastic resins, the standoffs 22A are formed on the semiconductor wafer 3, for example, by a resin ball mounting method.

Subsequently, as illustrated in FIG. 21A, the reinforcement resin 21A is attached on the semiconductor wafer 3, using a vacuum laminator or the like. Next, as illustrated in FIG. 21B, the semiconductor wafer 3 is cut into chip units, by a dicer (dicing apparatus) or the like. By segmenting the semiconductor wafer 3, the semiconductor chip 2A is manufactured.

Although the example in which the heating is performed by the head 31 has been described in the first embodiment and the second embodiment, the present application is not limited to the example described in the first embodiment and the second embodiment, and the heating may be performed by the stage on which the laminated semiconductor device 1 is placed. The stage on which the laminated semiconductor device 1 is placed includes a heater, and thereby, from the stage, heat can be given to the semiconductor chip 2D. The heat transfers from the semiconductor chip 2D to the semiconductor chip 2C, the heat transfers from the semiconductor chip 2C to the semiconductor chip 2B, and the heat transfers from the semiconductor chip 2B to the semiconductor chip 2A.

In the case where the heat is given to the semiconductor chip 2D from the stage, the reinforcement resin 21D is compressed after the temperature of the standoffs 22D reaches the predetermined temperature and the standoffs 22D deform. Next, the reinforcement resin 21C is compressed after the temperature of the standoffs 22C reaches the predetermined temperature and the standoffs 22C deform. Subsequently, the reinforcement resin 21B is compressed after the temperature of the standoffs 22B reaches the predetermined temperature and the standoffs 22B deform. Finally, the reinforcement resin 21A is compressed after the temperature of the standoffs 22A reaches the predetermined temperature and the standoffs 22A deform. Thus, similarly to the first embodiment, it is possible to compress the reinforcement resins 21A to 21C in the state where the reinforcement resins 21A to 21C have softened, and it is possible to even the joint state of each layer of the laminated semiconductor device 1. Further, since the heat is given to the semiconductor chip 2D from the stage, it is possible to compress the reinforcement resins 21A to 21C in a stepwise manner, similarly to the second embodiment. The heat may be given to the semiconductor chip 2D solely from the stage, or the heat may be given to the semiconductor chip 2D from the stage while the heat is given to the semiconductor chip 2A from the head 31.

Although the laminated semiconductor device 1 including the four laminated semiconductor chips 2A to 2D has been described in the first embodiment and the second embodiment, the first embodiment and the second embodiment are not limited to the laminated semiconductor device 1 including the four laminated semiconductor chips 2A to 2D. The laminated semiconductor device 1 according the first embodiment and the second embodiment may include three or more laminated semiconductor chips 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A laminated semiconductor device comprising:
   three or more semiconductor chips that are laminated;
   resins that are disposed among the semiconductor chips, the resins softening by heating; and
   support members that are disposed among the semiconductor chips and that contacts the adjacent semiconductor chips, the support members deforming by external force when a temperature of the support members reaching a predetermined temperature, the support members are not electrically connected with the semiconductor chips.

2. The laminated semiconductor device according to claim 1, wherein the support members are solders that melt when a temperature of the solders reach the predetermined temperature.

3. The laminated semiconductor device according to claim 1, wherein the support members are elastic bodies whose elastic moduli decrease by heating.

4. The laminated semiconductor device according to claim 1, wherein the predetermined temperature is higher than a softening temperature of the resins.

5. The laminated semiconductor device according to claim 1, wherein the support members include:
   a first support member that deforms by external force when a temperature of the first support member reaching a first predetermined temperature; and
   a second support member that deforms by external force when a temperature of the second support member reaching a second predetermined temperature, the second predetermined temperature being different from the first predetermined temperature.

6. The laminated semiconductor device according to claim 5, wherein the first predetermined temperature and the second predetermined temperature are higher than a softening temperature of the resins.

7. A manufacturing method of a laminated semiconductor device comprising:
   laminating at least three semiconductor chips; and
   heating and compressing at least one of the semiconductor chips,
   resins and support members are disposed among the semiconductor chips, the resins softening by heating, the support members deforming by external force when a temperature of the support members reaching a predetermined temperature, and the support members are not electrically connected with the semiconductor chips.

* * * * *